(12) United States Patent
Grivna et al.

(10) Patent No.: US 9,165,833 B2
(45) Date of Patent: Oct. 20, 2015

(54) METHOD OF FORMING A SEMICONDUCTOR DIE

(75) Inventors: Gordon M. Grivna, Mesa, AZ (US); Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 859 days.

(21) Appl. No.: 12/689,117

(22) Filed: Jan. 18, 2010

(65) Prior Publication Data
US 2011/0177675 A1    Jul. 21, 2011

(51) Int. Cl.
| | |
|---|---|
| H01L 21/306 | (2006.01) |
| H01L 21/784 | (2006.01) |
| H01L 21/3065 | (2006.01) |
| H01L 21/311 | (2006.01) |
| H01L 25/065 | (2006.01) |
| H01L 25/18 | (2006.01) |
| H01L 25/16 | (2006.01) |
| H01L 33/20 | (2010.01) |

(52) U.S. Cl.
CPC ........ *H01L 21/784* (2013.01); *H01L 21/30655* (2013.01); *H01L 21/31144* (2013.01); *H01L 25/0655* (2013.01); *H01L 25/18* (2013.01); H01L 25/167 (2013.01); H01L 33/20 (2013.01); H01L 2224/04042 (2013.01); H01L 2224/48091 (2013.01); H01L 2224/48137 (2013.01); H01L 2224/48145 (2013.01); H01L 2224/48245 (2013.01); H01L 2224/48247 (2013.01); H01L 2224/49175 (2013.01); H01L 2924/10253 (2013.01); H01L 2924/10329 (2013.01); H01L 2924/1305 (2013.01); H01L 2924/13091 (2013.01); H01L 2924/1431 (2013.01); H01L 2924/19041 (2013.01); H01L 2924/19042 (2013.01); H01L 2924/19043 (2013.01); H01L 2924/19102 (2013.01); H01L 2924/30107 (2013.01)

(58) Field of Classification Search
CPC .......................... H01L 21/3065; H01L 21/784
USPC .................................................. 438/460, 462
See application file for complete search history.

(56) References Cited

U.S. PATENT DOCUMENTS

| | | | |
|---|---|---|---|
| 4,820,377 | A | 4/1989 | Davis et al. |
| 5,075,253 | A | 12/1991 | Sliwa, Jr. |
| 5,856,705 | A | 1/1999 | Ting |
| 6,030,885 | A | 2/2000 | Bothra |
| 6,214,703 | B1 | 4/2001 | Chen et al. |
| 6,342,724 | B1 | 1/2002 | Wark et al. |

(Continued)

FOREIGN PATENT DOCUMENTS

| | | |
|---|---|---|
| JP | 05-267449 | 10/1993 |
| JP | 05-267559 | 10/1993 |

(Continued)

OTHER PUBLICATIONS

Office Action for counterpart Japanese Application No. P2011-007523, dated Oct. 14, 2014, 7 pages.

(Continued)

*Primary Examiner* — Alexander Ghyka
(74) *Attorney, Agent, or Firm* — Robert F. Hightower

(57) ABSTRACT

In one embodiment, semiconductor die having non-rectangular shapes and die having various different shapes are formed and singulated from a semiconductor wafer.

7 Claims, 25 Drawing Sheets

(56) References Cited

U.S. PATENT DOCUMENTS

| | | |
|---|---|---|
| 6,406,979 B2 | 6/2002 | Fischer et al. |
| 6,528,864 B1 | 3/2003 | Arai |
| 6,642,127 B2 | 11/2003 | Kumar et al. |
| 6,686,225 B2 | 2/2004 | Wachtler |
| 6,897,128 B2 | 5/2005 | Arita |
| 6,969,669 B2 | 11/2005 | Arita |
| 7,060,531 B2 | 6/2006 | Arita |
| 7,129,114 B2 | 10/2006 | Akram |
| 7,253,477 B2 | 8/2007 | Loechelt et al. |
| 7,335,576 B2 | 2/2008 | David et al. |
| 7,488,668 B2 | 2/2009 | Arita et al. |
| 7,629,228 B2 | 12/2009 | Haji et al. |
| 7,678,670 B2 | 3/2010 | Arita et al. |
| 7,767,551 B2 | 8/2010 | Arita et al. |
| 7,906,410 B2 | 3/2011 | Arita et al. |
| 2003/0207579 A1 | 11/2003 | Rattner et al. |
| 2004/0102025 A1 | 5/2004 | Arita |
| 2005/0084996 A1 | 4/2005 | Harper |
| 2005/0104165 A1 | 5/2005 | Ishio et al. |
| 2006/0030078 A1 | 2/2006 | Jiang et al. |
| 2006/0118515 A1 | 6/2006 | Dolechek et al. |
| 2006/0244096 A1 | 11/2006 | Sekiya |
| 2007/0087524 A1 | 4/2007 | Montgomery |
| 2007/0132034 A1 | 6/2007 | Curello et al. |
| 2007/0249178 A1* | 10/2007 | Ogihara .................. 438/753 |
| 2009/0032928 A1 | 2/2009 | Chiang et al. |
| 2009/0057838 A1 | 3/2009 | Arita et al. |
| 2009/0065904 A1 | 3/2009 | Wang |
| 2009/0298231 A1* | 12/2009 | Carothers ................. 438/113 |
| 2010/0048001 A1 | 2/2010 | Harikai et al. |
| 2010/0055875 A1 | 3/2010 | Haji et al. |
| 2010/0173474 A1 | 7/2010 | Arita et al. |

FOREIGN PATENT DOCUMENTS

| | | |
|---|---|---|
| JP | 11-168172 | 6/1999 |
| JP | 2005-294842 | 10/2005 |
| JP | 2009-164263 | 7/2009 |
| WO | WO 01/56063 A2 | 8/2001 |
| WO | WO 01/56063 A3 | 8/2001 |
| WO | 2004066382 A1 | 8/2004 |
| WO | 2007007883 A1 | 1/2007 |
| WO | 2008081968 A1 | 7/2008 |
| WO | 2009063620 A1 | 5/2009 |

OTHER PUBLICATIONS

Office Action and Search Report mailed Apr. 23, 2015 in corresponding Taiwan Application No. 099147007.

* cited by examiner

METHOD OF FORMING A SEMICONDUCTOR DIE

The present application is related to a United States patent application entitled METHOD OF FORMING A SEMICONDUCTOR DIE, now U.S. Pat. No. 8,384,231, related to a United States patent application entitled SEMICONDUCTOR DIE SINGULATION METHOD, now U.S. Pat. No. 7,989,319, related to a United States patent application entitled SEMICONDUCTOR DIE SINGULATION METHOD, now U.S. Pat. No. 8,012,857, related to a United States patent application entitled METHOD OF FORMING AN EM PROTECTED SEMICONDUCTOR DIE, now US publication no. 2011/0175209, and related to a United States patent application entitled METHOD OF FORMING AN EM PROTECTED SEMICONDUCTOR DIE, now US publication no. 2011/0175225, all of which are filed concurrently herewith, have at least one common inventor, a common assignee, and are hereby incorporated herein by reference.

BACKGROUND OF THE INVENTION

The present invention relates, in general, to electronics, and more particularly, to semiconductors, structures thereof, and methods of forming semiconductor devices.

In the past, singulation lines generally were formed as a plurality of parallel lines where each singulation line extended axially, such as along a long axis of the singulation line, from one side of the wafer straight across the wafer in order to allow wafer saws or scribe lines to extend in a straight line across the wafer. Each of the prior singulation lines generally extended straight across the wafer and did not have curves, bends, angles, or other shapes other than one continuous straight line. In order to facilitate using the straight singulation lines, prior semiconductor die generally had a regular shape such as all die having the same total area and the same shape that was usually a square or rectangular shape. The regular shaped die were also arranged in a regular pattern on a wafer so that the singulation lines could extend between the die and singulate the die. The straight lines of the rectangular or square shape and the same area of the die, along with the regular pattern, allowed using the straight singulation lines. These singulation lines forced die to have regular shapes of squares and rectangles in order to use these axially extending singulation lines.

Accordingly, it is desirable to have a method of forming a semiconductor die that does not require the axial singulation lines.

Figure 1:
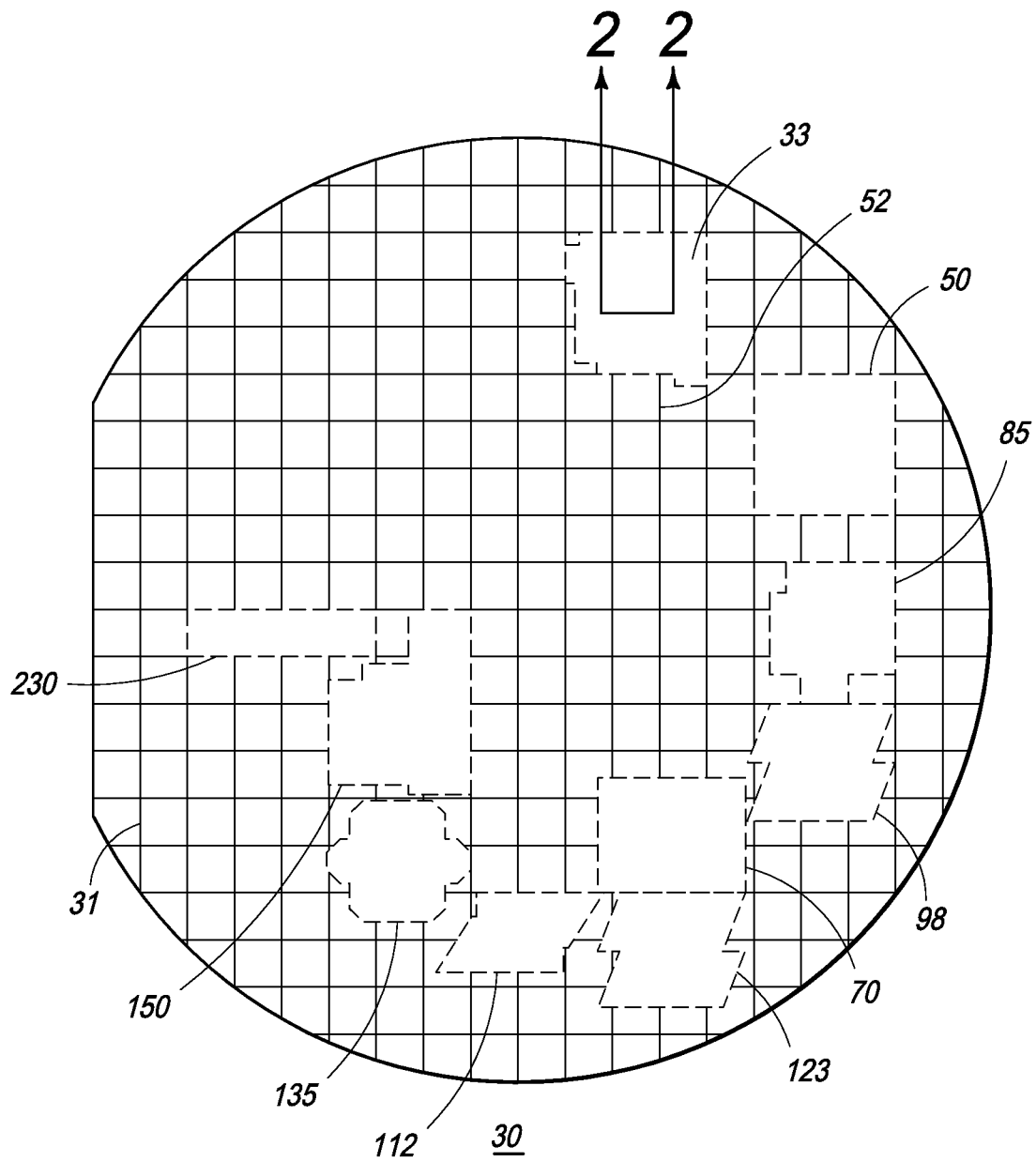
FIG. 1 illustrates a reduced plan view of an embodiment of a semiconductor wafer in accordance with the present invention.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action.

The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

As used herein, symmetrical shapes means at least two shapes that have correspondence in size, shape, and relative position of parts on opposite sides of a dividing line or media plane or about a center or axis, a shape is symmetrical if it is unchanged by a reflection, or a rotation. The term asymmetrical means a shape that is not symmetrical, a shape is asymmetrical if it is changed by a reflection, or a rotation. The term rectangle means a closed planar quadrilateral with opposite sides of equal lengths, and with four right angles. Non-rectangular means a closed geometric shape that is not a rectangle. The term multiply-connected means an open set in the plane which has holes in it. A shape is multiply-connected if it has a hole through it, for example, a doughnut shape.

DETAILED DESCRIPTION OF THE DRAWINGS

FIG. 1 illustrates a reduced plan view of an example of an embodiment of a semiconductor wafer 30 on which a plurality of semiconductor die may be formed. The semiconductor die on wafer 30 may all have the same shape or may have different shapes. The die are separated from each other by portions of wafer 30 which will be removed, such as singulation regions, in order to singulate each die. The singulation regions surround each die on wafer 30 so that the singulation regions of wafer 30 may be removed in order to singulate the die. As is well known in the art, all of the plurality of semiconductor die on wafer 30 generally are separated from each other on all sides by portions of wafer 30 where the singulation regions are formed. The die on wafer 30 may be formed as any type of semiconductor die including a diode, a vertical transistor, a lateral transistor, or an integrated circuit that includes a variety of types of semiconductor devices.

As will be seen further hereinafter, the die formed on wafer 30 generally require that the singulation regions of wafer 30 are portions of wafer 30 that do not extend axially or straight across the surface of wafer 30. Those skilled in the art will appreciate that some portions of wafer 30 are illustrated in FIG. 1 to have singulation lines that do extend axially across wafer 30 such as from one side of wafer 30 to an opposite side of wafer 30. An example of such a singulation line is illustrated by line 31. In general, in other embodiments, wafer 30 may have singulation lines that extend axially across part of wafer 30 and terminate at the boundaries of the singulation regions of wafer 30, such as a singulation line 32 that terminates at singulation regions illustrated by dashed lines 33 and 112, as will be seen further hereinafter. In other embodiments, wafer 30 may not have any singulation lines that extend axially across even a portion of wafer 30.

Figure 2:
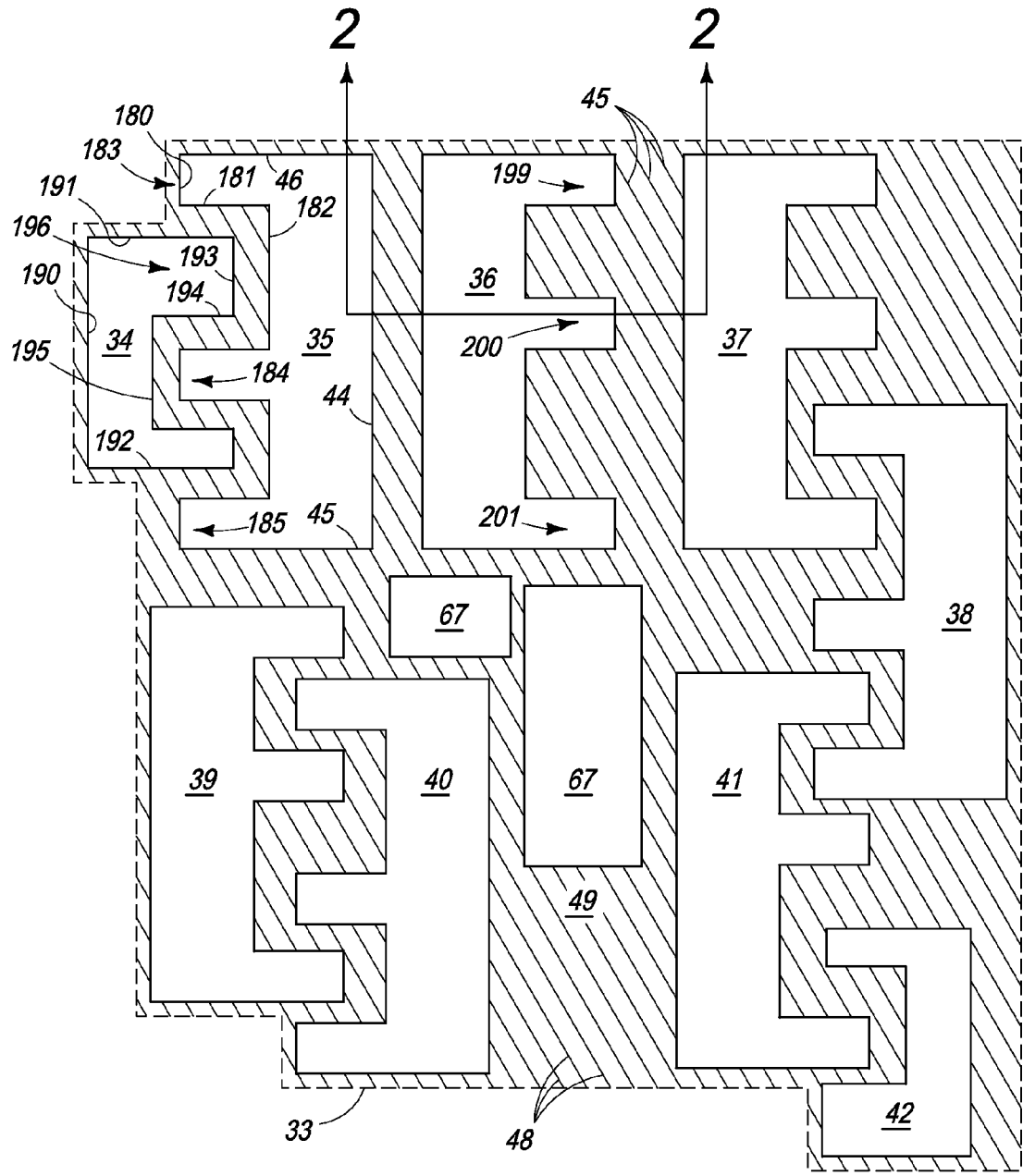
FIG. 2 illustrates an enlarged plan view of an example of an embodiment of a plurality of die of the wafer of FIG. 1 in accordance with the present invention.

FIG. 2 illustrates an enlarged plan view of an example of an embodiment of a plurality of die having protrusions, such as die 34-42, that are formed on a portion of wafer 30 as identified by a dashed line 33 in FIGS. 1 and 2.

The shape of the outer periphery of the plan view or top surface of any one of die 34-42 has protrusions because at least one side of any one of the die has a protrusion or finger extending from the die. The outer periphery of the plan view, such as the top surface, of any one of die 34-42 is not just the active region of the die but is the actual periphery of the die after the die is singulated. For example, die 35 is illustrated to have a right side 44, a bottom side 45, and a top side 46 that are each formed as a single straight line. However, the left side of die 35 has protrusions instead of being a straight line. Thus, the periphery of die 35 includes a plurality of sides that do not all have the same size and dimensions. The left side of die 35 includes a plurality of protrusions, such as protrusions or fingers 183, 184, and 185 extending outwardly from an innermost portion of the left side of die 35 such as side 182. Each of the protrusions or fingers form a portion of the periphery of die 35 and each protrusion has sides that are a portion of the periphery such as sides 180 and 181 of protrusion 183. The protrusions form some portions of the periphery, such as side 180, to jut out from the other surrounding sides or portions, such as from side 181 or 182. Thus, die 35 has protrusions extending outwardly along the periphery of die 35. Die 36 has similar protrusions 199, 200, and 201. As can be seen from FIG. 2, the dimensions of die 35 have three or more values depending on where the dimensions are measured. For example, the length along side 44 has one value, but the width has two or more values such as the width from side 44 to side 180 or the width from side 44 to side 182. Thus, the width has at least a maximum value and a minimum value.

Die 34 has a different shape than die 35 but also has protrusions such as protrusions 196 and 197. In the embodiment illustrated in FIG. 2, protrusion 196 of die 34 extends between protrusions 183 and 184 of die 35 and is positioned within a recess formed between protrusions 183 and 184 of die 35. The spacial or positional relationship between die 34 and 35 often is referred to as being inter-digitated.

Those skilled in the art will appreciate that any one of die 34-42 is non-rectangular because none of die 34-42 have a shape of the outer periphery of the plan view of the die that is a quadrilateral and that has four (4) congruent angles.

Also, any of die 34-42 has an irregular shape because the shape of the outer periphery of the top surface of the die prevents singulating the die by using an axial singulation line that extends axially in-between one of die 35-42 and an adjacent one of die 35-42. For example an axial singulation line that extends axially through the portion of wafer 30 that is in-between die 36 and 37 can not be used to singulate die 36 because the outer periphery of die 36 has protrusions and the portion of wafer 30 that is in-between protrusions 200 and 201 of die 36 and in-between protrusions 199 and 200 can not be removed by such an axial singulation line. Thus, the irregular shape prevents singulating any one of die 34-42 by using an axial singulation line.

Additionally, any one of die 35-42 are considered to be arranged on wafer 30 in an irregular pattern because an axial singulation line that extends axially along one side of one of die 35-42 through at least a portion of a singulation region 49, such as parallel to side 44 of die 35, would intersect interior portions of adjacent die such as die 40. Consequently, some of die 35-42 can not be singulated from wafer 30 using axial singulation lines that extend axially across the portion of wafer 30 that includes the die to be singulated because the irregular pattern would cause such axial singulation lines to traverse through an interior of at least one of the die. Therefore, singulation region 49 that surrounds die 35-42 does not form a continuous straight line that extends axially across the portion of wafer 30 where die 51-56 are positioned.

After forming die 34-42, portions of wafer 30 that surround die 36-42, such as portions of singulation region 49, are simultaneously removed using a simultaneous singulation method in order to singulate die 36-42 into individual die. The portions of wafer 30 that generally may be removed are illustrated by crosshatched lines 48. The type of crosshatching has no meaning other than to illustrate the portion of wafer 30 that may be removed. Those skilled in the art will appreciate that not all of region 49 has to be removed in order to singulate the die but only a portion that surrounds the outer periphery has to be removed, as will be seen further hereinafter.

Because of the protrusions of die 34-42 or alternately because of the irregular shape of die 34-42 or because of the irregular pattern of die 34-42, singulation region 49 that surrounds die 34-42 does not form a continuous straight line that extends axially across wafer 30 or even axially through the portion of wafer 30 where die 34-42 are positioned. Such a continuous straight line singulation region would extend though portions of die 34-42 and damage the die. Alternately, a portion of wafer 30 would have to be left along one side of the die, such as along protrusions 183, 184, and 185 of die 35, in order to have a straight singulation line. This extra portion of wafer 30 would waste a portion of wafer 30 and reduce the number of die that may be formed in a given area such as on a given area of wafer 30. However, since a simultaneous singulation method is used to remove at least portions of singulation region 49, die 34-42 may be arranged and positioned on wafer 30 in a configuration that maximizes the use of wafer 30 and increases the number of die that can be formed on wafer 30.

In order to maximize the number of this type of die that can be placed in a given area, such as an area of wafer 30, the die may be arranged in an inter-digitated position, such as illustrated by die 39 and 40 or die 37, 38, 41, and 42. As a result of the inter-digitated position, singulation region 49 that surrounds the protrusions of the die does not form a continuous straight line that extends axially across wafer 30. A continuous straight singulation line that only extends axially across the portion of wafer 30 where die 34-42 are positioned would form a line that would extend from a side of one of the die, such as along side 44 of die 35, though portions of other die, such as through interior portions of die 40, and damage the die.

Additionally, die 34-42 are considered to be arranged on wafer 30 in a non-centric pattern because the center of a first die of the plurality of semiconductor die, such as the center of die 35, is staggered in relation to the center of an adjacent semiconductor die, such as the center of die 39 or die 40.

The simultaneous singulation method of simultaneously removing at least portions of region 49 as the singulation region typically includes using a dry etch as described in United States patent publication no. 2009/0042366 of inventor Gordon M. Grivna that was published on Feb. 12, 2009. Using the dry etching method to simultaneously singulate die 34-42, allows forming die 34-42 with the shape having protrusions, and/or with the irregular shape and/or forming die 34-42 in an irregular pattern on wafer 30 and/or forming die 34-42 in a non-centric pattern on wafer 30. Other methods of simultaneously singulating die from a wafer, such as die 34-42, are explained hereinafter such as relating to FIGS. 11-22.

Those skilled in the art will appreciate that in some embodiments, region 49 may also have etching enhancement sections 67 that assist in increasing the etch rate when singulating the semiconductor die. Sections 67 are portions of region 49, thus portions of wafer 30, that are not removed when die 34-42 are singulated. In some embodiments, sections 67 can increase the etch rate in the equipment used for singulating die 34-42. Sections 67 may be formed in any portion of region 49 where there is a space between any of die 34-42.

In the example configuration of die 34 and 35, die 34 and 35 have different shapes. Die 34 and 35 may be singulated together. After singulation, die 34 and 35 may be assembled into one package and positioned in an inter-digitated position within the package. This inter-digitated position can be used to provide a low inductance interconnect between two different types of die. In another example, two such die may be formed on different wafers as two different type of die, such as a low power logic circuit and a high power transistor. The close proximity of the die would allow routing interconnections from one die to the other die using short interconnections. This results in a low inductance connection that can improve the operating characteristics of the two die.

Figure 3:
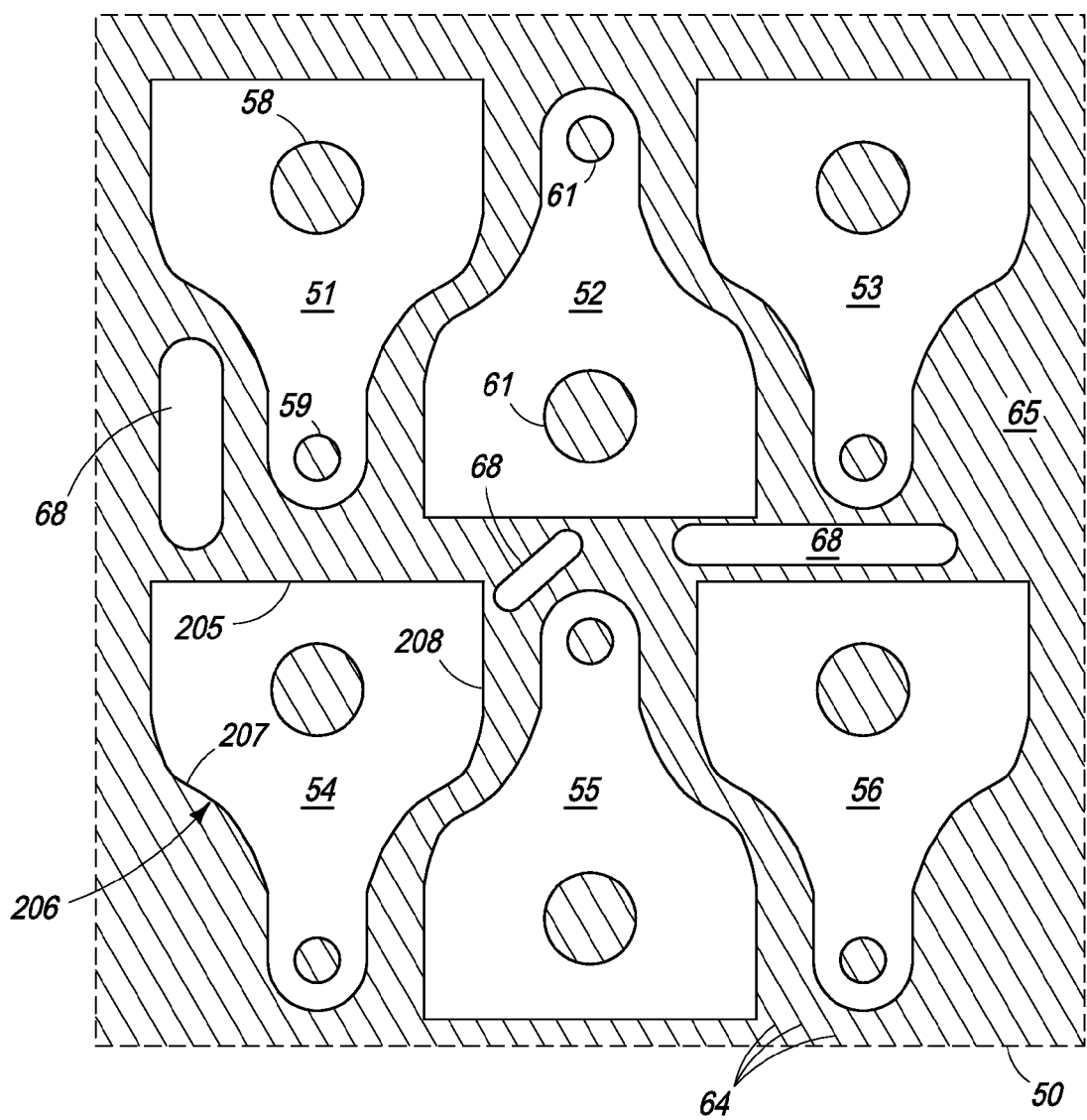
FIG. 3 illustrates an enlarged plan view of an example of an embodiment of another plurality of die of the wafer of FIG. 1 in accordance with the present invention.

FIG. 3 illustrates an enlarged plan view of an example of an embodiment of a plurality of non-rectangular shaped die, such as die 51-56, that are formed on a portion of wafer 30 as identified by a dashed line 50 in FIGS. 1 and 3. Any one of die 51-56 are non-rectangular because the shape of the outer periphery of the plan view of the die is not a quadrilateral that has four (4) congruent angles. Additionally, the periphery of any one of die 51-56 has at least one curved shape instead of the periphery being formed by straight lines. Thus, the periphery of any of die 51-56 includes a plurality of sides where at least one side includes a portion that is curved and is not a straight line. For example, die 54 is illustrated to have a side 205 that is a straight line. Die 54 also has another side 206, identified in a general manner by an arrow, that includes a curved portion 207. Thus, the periphery of die 51-56 has a non-rectangular shape and includes at least one side that has a curved shape.

Furthermore, the shape of the outer periphery of any of die 51-55 is also multiply-connected since die 51-55 are formed with openings, such as holes or openings 58 and 61, through the die. As used herein, multiply-connected means an open set in the plane which has a hole in it. Thus, any one die 51-55 is multiply-connected because they each have a hole through the die. For example, die 51 has holes 58 and 59 that are two different sizes, and die 52 has holes 61 that are both the same size. Thus, the die have a multiply-connected topology.

Figure 6:
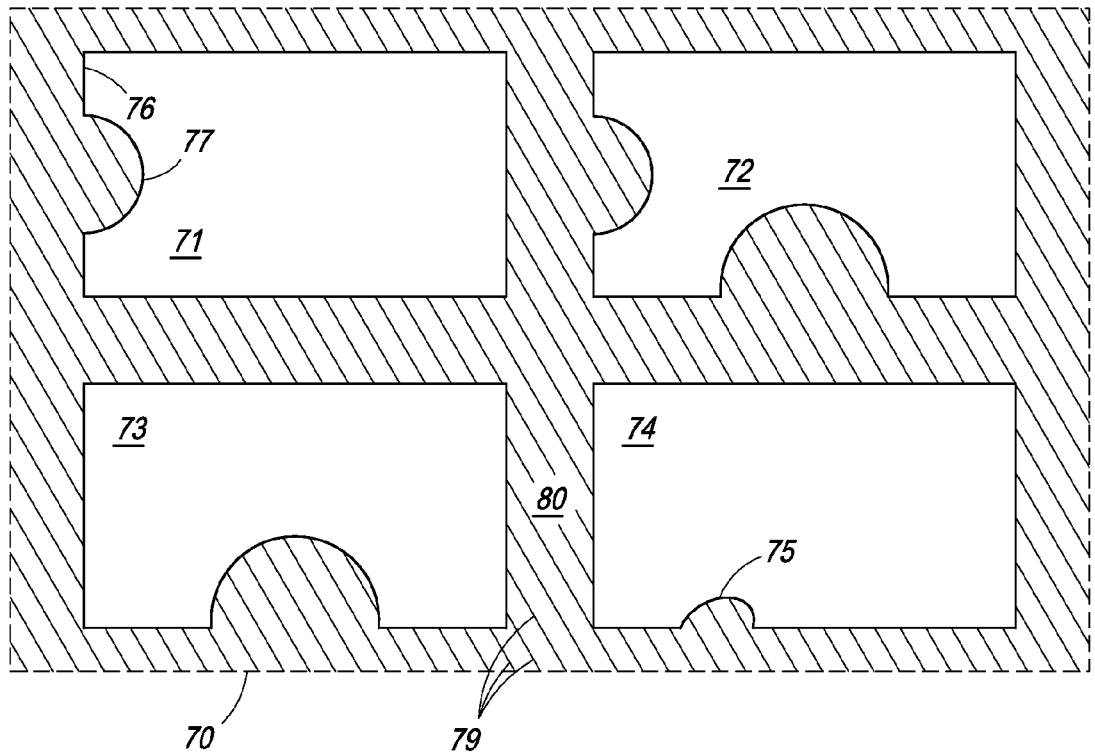

After forming die 51-56, portions of wafer 30 that surround die 51-56 are simultaneously removed in order to singulate die 51-56 into individual die. Some portions of wafer 30 that usually may be removed are illustrated by crosshatched lines 64. Because of the non-rectangular shape, using the simultaneous singulation method allows die 51-56 to be arranged and positioned on wafer 30 in a configuration that maximizes the use of wafer 30 and increases the number of die that can be formed on wafer 30. The simultaneous singulation method allows the holes through die 51-56 to also be formed during singulation. Those skilled in the art will appreciate that the opening formed through any of die 51-56 during the singulation does not divide the die into pieces such as cutting the die in half but forms an opening through one portion of the die, for example as illustrated in FIG. 3, or it may form the opening along an edge of the periphery of the die, for example as illustrated in FIG. 6. Alternately, the holes may be formed prior to singulation.

In one embodiment (but not necessarily all embodiments), in order to maximize the number of this type of die that can be placed in a given area, such as an area of wafer 30, the die may be staggered so that a narrow portion of one die may be positioned next to a wide portion of an adjacent die. The staggered pattern and positioning of die 51-56 may cause one side of one die, when extended, to intersect an interior portion of at least one adjacent die. For example, extending side 208 of die 54 would cause side 208 to intersect traverse into the interior of die 52. This staggered positioning can increase the number of non-rectangular shaped die that can be formed in a given area of wafer 30. As a result of the staggered position, singulation region 65 that surrounds the die does not form a continuous straight line that extends axially across wafer 30. A continuous straight singulation line that extended axially across the portion of wafer 30 where die 51-56 are positioned would form a line that would extend from a side of one of the die, such as along side 208 of die 54, though portions of other die, such as through interior portions of die 52, and damage the die.

Die 51-56 also have an irregular shape because the shape of the outer periphery of the die prevents singulating the die by using an axial singulation line that extends axially in-between one of die 51-56 and an adjacent one of die 51-56. For example, an axial singulation line that extends axially in-between die 51 and 52 can not be used to singulate die 52 because the straight singulation line could not remove the curved portion of the periphery.

Additionally, die 51-56 are considered to be arranged on wafer 30 in an irregular pattern because a singulation line along one side of one of die 51-56, such as parallel to side 208 of die 54, would intersect interior portions of adjacent die such as die 52. Consequently, some of die 51-56 can not be singulated from wafer 30 using axial singulation lines that extend axially across wafer 30 or across the portion of wafer 30 where die 51-56 are positioned because the irregular pattern would cause such singulation lines to traverse through at least one of the die. Therefore, singulation region 65 that surrounds die 51-56 does not form a continuous straight line that extends axially across the portion of wafer 30 where die 51-56 are positioned.

Those skilled in the art will appreciate that in some embodiments, region 65 may also have etching enhancement sections 68 that assist in increasing the etch rate when singulating the semiconductor die. Sections 68 are portions of region 65, thus portions of wafer 30, that are not removed when die 51-56 are singulated similarly to sections 67 of FIG. 2. Sections 68 may be formed in any portion of region 65 where there is a space between any of die 51-56.

Figure 4:
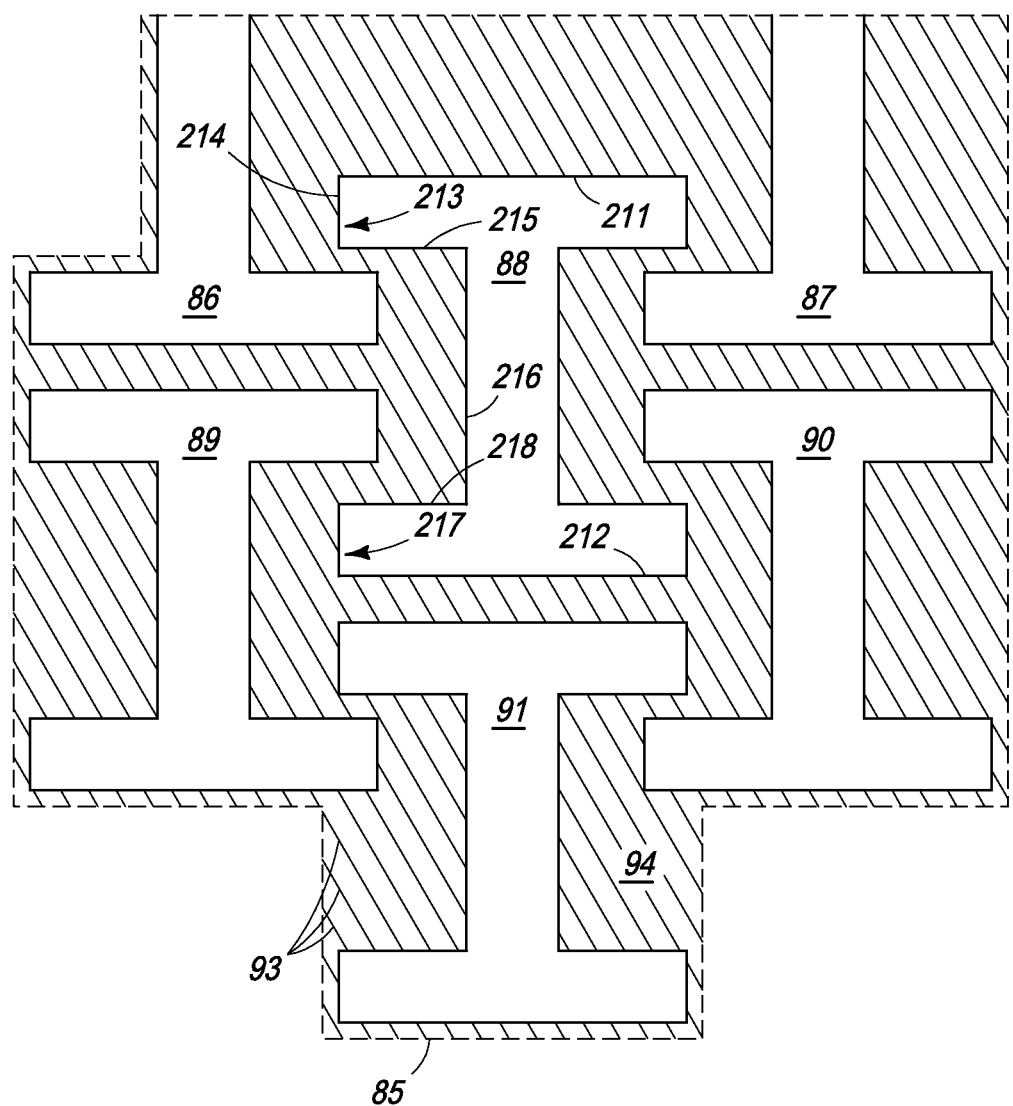
FIGS. 4-10 illustrates enlarged plan views of examples of various other embodiments of die of the wafer of FIG. 1 in accordance with the present invention.

FIG. 4 illustrates an enlarged plan view of an example of an embodiment of a plurality of die that have protrusions, such as die 86-91, that are formed on a portion of wafer 30 as identified by a dashed line 85 in FIGS. 1 and 4. Die 86-91 have protrusions because at least one side of the periphery of the plan view of the die have a protrusion or finger extending from the die. For example, die 88 is illustrated to have a top side 211 and a bottom side 212 that are each formed as a single straight line. However, the left side and right side of the periphery of die 88 have protrusions instead of each one being a single straight line. Thus, the periphery of die 88 includes a plurality of sides that do not all have the same size and dimensions. The left side of die 88 includes a plurality of protrusions, such as protrusions or fingers 213 and 217 extending outwardly from an innermost portion of the left side of die 88, such as side 216. The protrusions form some portions of the periphery, such as side 214 of die 88, to jut out from the other surrounding sides or nearby sides, such as side 215 or 216. Each of the protrusions or fingers form a portion of the periphery of die 88 and each protrusion has sides that are a portion of the periphery such as sides 214 and 215 of protrusion 213. Die 88 also has similar protrusions on the right side of die 88. Thus, the periphery of any of die 86-91 includes a plurality of sides wherein at least one side has a protrusion or finger extending from at least one portion of the die.

In order to maximize the number of this type of die that can be placed in a given area, such as an area of wafer 30, the die may be arranged in an inter-digitated position, such as illustrated by die 88 and 89 and die 88 and 90.

Die 86-91 are also considered to have an irregular shape because the shape of the outer periphery of the top surface or plan view of the die prevents singulating at least a portion of one of the die by using an axial singulation line that extends axially in-between one of die 86-91 and an adjacent one of die 86-91. For example, an axial singulation line that extends axially along side 214 of die 88 will not remove the portion of wafer 30 that is adjacent to side 216 of die 88. Thus, the irregular shape prevents singulating any one of die 86-91 by using an axial singulation line.

Additionally, die 86-91 are considered to be arranged on wafer 30 in an irregular pattern because a singulation line along one side of one of die 86-91, such as parallel to side 214 of die 88, would intersect interior portions of adjacent die such as die 86 or 89. Consequently, some of die 86-91 can not be singulated from wafer 30 using axial singulation lines that extend axially across wafer 30 or even the portion of wafer 30 where die 86-91 are positioned because the irregular pattern would cause such axial singulation lines to traverse through at least one of the die. Therefore, singulation region 94 that surrounds die 86-91 does not form a continuous straight line that extends axially across wafer 30 or even the portion of wafer 30 where die 86-91 are positioned. Those skilled in the art will also appreciate that any one of die 86-91 is non-rectangular.

After forming die 86-91, portions of wafer 30 that surround die 86-91, such as portions of singulation region 94, are simultaneously removed in order to singulate die 86-91 into individual die. The portions of wafer 30 that usually may be removed are illustrated by crosshatched lines 93. As a result of the inter-digitated position, singulation region 94 that surrounds the protrusions of the die does not form a continuous straight line that extends axially across wafer 30. A continuous straight line singulation line would form a line that would extend from a side of one of the die, such as along side 216 of die 88, though portions of die 88 and through other die, such as through portions of die 91, and damage the die.

Figure 5:
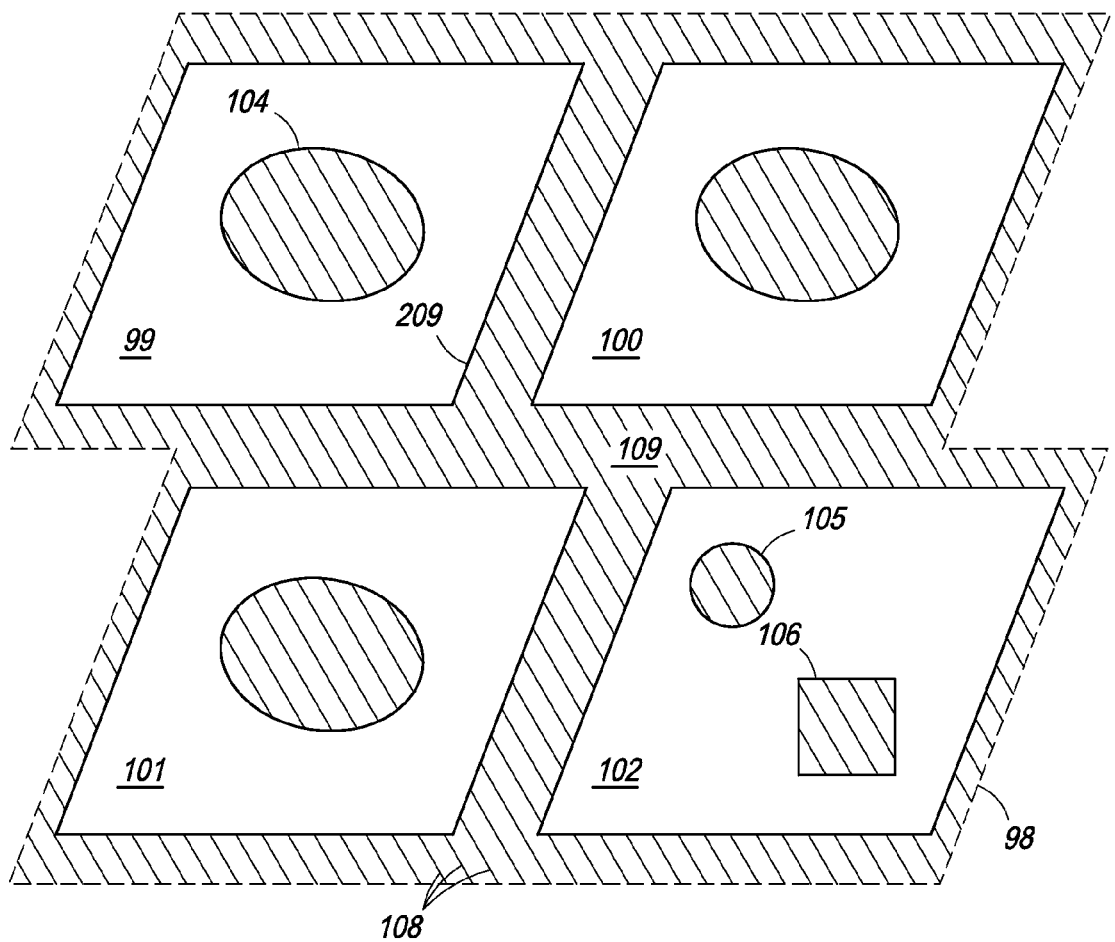

FIG. 5 illustrates an enlarged plan view of an example of an embodiment of a plurality of multiply-connected die, such as die 99-102, that are formed on a portion of wafer 30 as identified by a dashed line 108 in FIGS. 1 and 5. Die 99-102 are multiply-connected because the periphery of the top surface of die 99-102 has a hole through it. Die 99-102 also have a non-rectangular shape because the outer periphery of the top surface of die 71-74 is non-rectangular. A singulation region 109 of wafer 30 surrounds the periphery of each of die 99-102. Die 99-102 are illustrated as parallelograms that have at least one opening or hole through the die. Additionally, die 102 has openings 105 and 106 that are formed through die 102. Because openings 105 and 106 are different shapes, die 102 is asymmetrical.

After forming die 99-102, portions of wafer 30 that surround die 99-102, such as portions of singulation region 109, are simultaneously removed in order to singulate die 99-102 into individual die. The portions of wafer 30 that usually may be removed are illustrated by crosshatched lines 108. Even though the sides of die 99-102 are straight lines, the sides do not intersect as a right angle, thus, die 99-102 are arranged in a staggered pattern relative to each other in order to maximize the number of die that can be formed in a given area such as on the surface of wafer 30. The staggered pattern or positioning of die 99-102 may cause one side of one die, when extended, to intersect an interior portion of at least one adjacent die. For example, extending side 209 of die 99 would cause side 209 to intersect or traverse into the interior of die 101. Because of the staggered pattern, singulation region 109 that surrounding die 99-102 does not form a continuous straight line that extends axially across the portion of wafer 30 that includes die 99-102. A continuous straight line singulation region that extends axially across the portion of wafer 30 where die 99-102 are positioned would extend though portions of die 99-102 and damage the die. Alternately, the distance between the die, such as between the sides of die 99 and 100, would have to be increased to allow a straight continuous singulation line to extend between the die but this would decrease the number of die that could be formed on a wafer.

Additionally, die 99-102 are considered to be, arranged on wafer 30 in an irregular pattern because a singulation line along one side of one of die 99-102, such as parallel to side 209 of die 99, would intersect interior portions of adjacent die such as die 101. Consequently, some of die 99-102 can not be singulated from wafer 30 using singulation lines that extend axially across the portion of wafer 30 that includes die 99-102 because the irregular pattern would cause such singulation lines to traverse through at least one of the die. Therefore, singulation region 109 that surrounds die 99-102 does not form a continuous straight line that extends axially across wafer 30 or even just across the portion of wafer 30 that includes die 99-102, such as region 109.

Since a simultaneous singulation method is used to remove singulation region 109, die 99-102 may be arranged and positioned on wafer 30 in a configuration that maximizes the use of wafer 30 and increases the number of die that can be formed on wafer 30.

After die 99-102 are singulated, the die may be assembled together with other die including positioning other die within the openings that are formed through any of die 99-102. For example, die 99 may be formed as a low power logic circuit of control circuit, and another die may be formed as a high power device such as a power transistor. The power transistor may be positioned inside the opening in die 99 and the two die can function together. Alternately, die 99-102 may be a power transistor and another type of die may be assembled within the opening in any of die 99-102. This allows forming very close and short interconnections thereby minimizing parasitic resistance and inductance in the connections. Alternately, a heat sink may be assembled into the opening of die 99 in order to assist in dissipating power created during the operation of die 99. Alternately, dielectrics or metallic materials may be selectively assembled into the openings to enhance the device performance such as providing a heat sink or to provide a direct and low resistance electrical connection from an element formed on the top surface of the die to an element formed on the bottom surface of the die.

FIG. 6 illustrates an enlarged plan view of an example of an embodiment of a plurality of irregular shaped die, such as die 71-74, that are formed on a portion of wafer 30 as identified by a dashed line 70 in FIGS. 1 and 6. Die 71-74 also include a curved shape along a portion of the outer periphery of the top surface of the die. Instead of having an opening through an interior of die 71-74 as did die 99-102, die 71-74 have a periphery that includes a curved portion that may be used for the same applications as the openings in die 99-102. Because of the curved portion of the periphery of die 71-74, die 71-74 could not be singulated by singulation lines that extended axially across the portion of wafer 30 that includes die 71-74. The curved shape of die 71-74 prevents using an axial singulation line to remove the portion of wafer 30 that is adjacent to the die. For example, the portion of wafer 30 that is adjacent to side 77 of die 71 can not be removed by an axial singulation line. Additionally, die 74 has an asymmetrical shape because the positioning of side 75 makes the shape of the periphery of the plan view or top surface of die 74 asymmetrical. Therefore, a singulation region 80 is formed to surround the periphery of die 71-74 to facilitate singulating die 71-74 from wafer 30. The portions of wafer 30 that usually may be removed are illustrated by crosshatched lines 79. Because of the curved portion of the periphery, singulation region 80 does not form a continuous straight line that extends axially across wafer 30 or even just across the portion of wafer 30 that includes die 71-74 Die 71-74 may be singulated as explained in the description of die 99-102.

Figure 7:
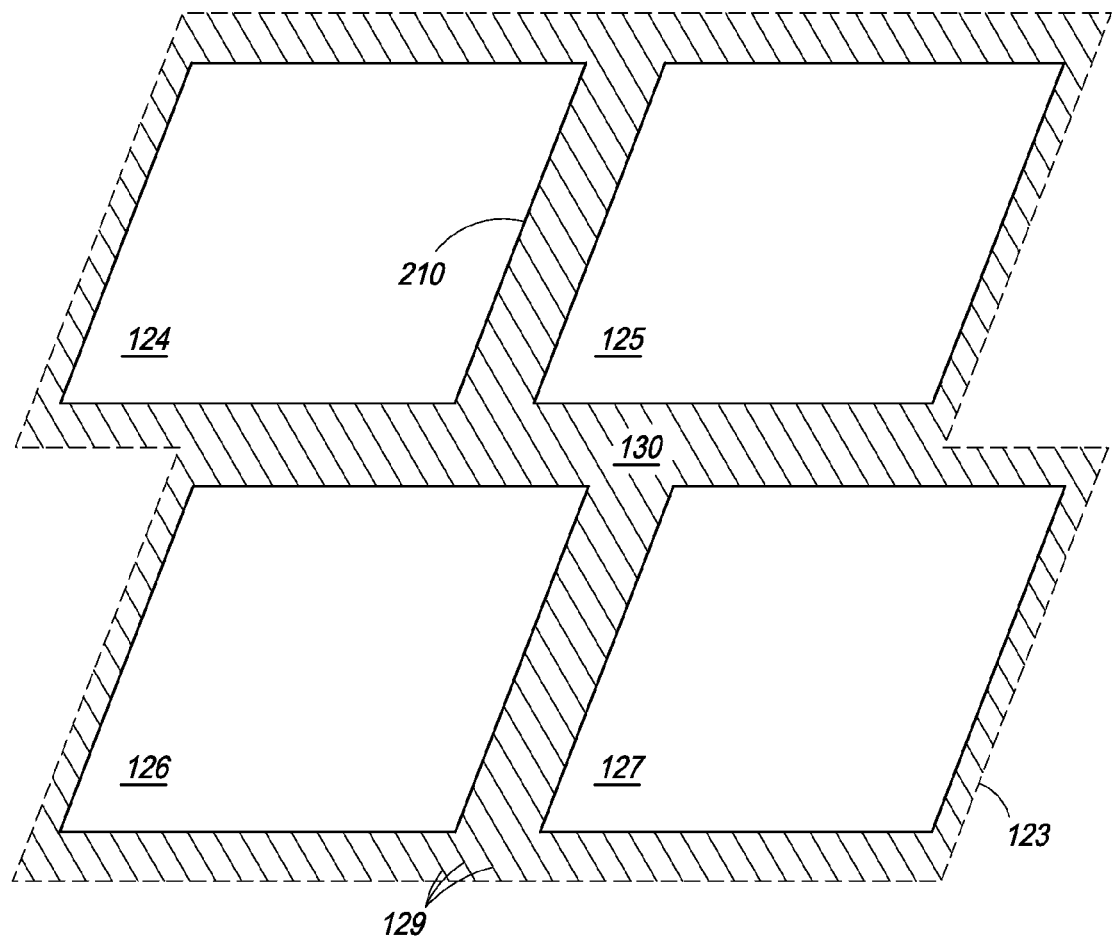

FIG. 7 illustrates an enlarged plan view of an example of an embodiment of a plurality of die 124-127 having a periphery of a top surface of the die that has a non-rectangular shape. Die 124-127 are formed on a portion of wafer 30 as identified by a dashed line 123 in FIGS. 1 and 4. Die 124-127 are similar to die 99-102 of FIG. 5 and have the same die shape and similar positioning, except that die 124-127 are not multiply-connected. A singulation region 130 of wafer 30 surrounds the periphery of each of die 124-127. The portions of wafer 30 that usually may be removed are illustrated by crosshatched lines 129.

Because the sides of die 124-127 do not intersect at right angles, a straight line that extends from any side of one of die 124-127 will traverse through another one of die 124-127. Because of this configuration, die 124-127 cannot be singulated using singulation lines that extend axially across wafer 30 or even the portion of wafer 30 where die 124-127 are positioned. Consequently, singulation region 130 that surrounds die 124-127 does not form a continuous straight line that extends axially across the portion of wafer 30 where die 124-127 are positioned or formed.

Additionally, die 124-127 are considered to be arranged on wafer 30 in an irregular pattern because a singulation line along one side of one of die 124-127, such as parallel to side 210 of die 124, would intersect interior portions of adjacent die such as die 126. Consequently, some of die 124-127 can not be singulated from wafer 30 using singulation lines that extend axially across the portion of wafer 30 where die 124-127 are formed because the irregular pattern would cause such singulation lines to traverse through at least one of the die. Therefore, singulation region 130 that surrounds die 124-127 does not form a continuous straight line that extends axially across wafer 30. Those skilled in the art will understand that die 124-127 may be arranged on wafer 30 in a different pattern that allows the use of an axial singulation line to remove die 124-127.

Although die 124-127 are illustrated in a non-centric pattern on wafer 30, the center of die 124-127 may be aligned in a straight line or may be positioned to be non-centric. However, such a configuration still prevents singulating die 124-127 using axial singulation lines that extend axially across the portion of wafer 30 where die 124-127 are formed.

Figure 8:
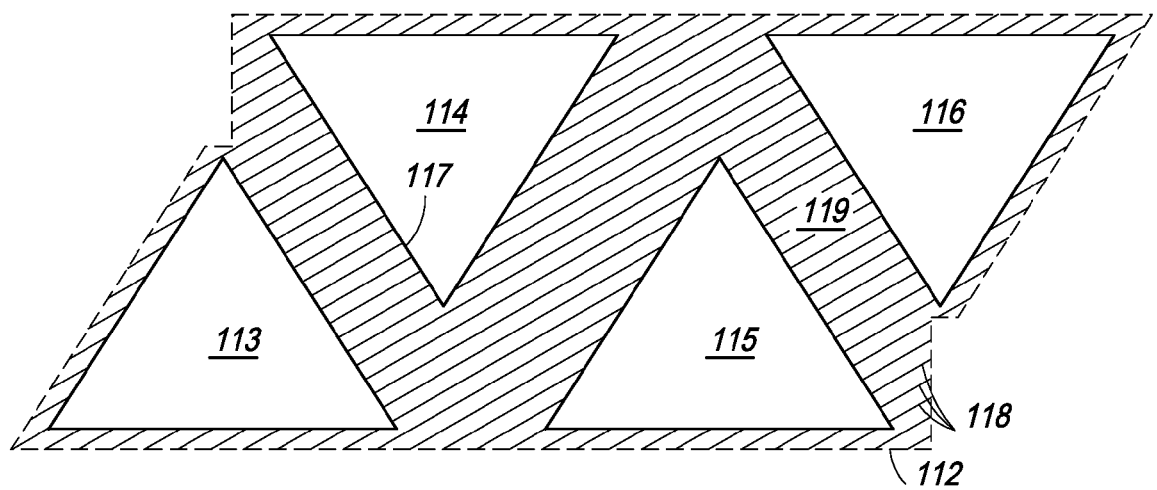

FIG. 8 illustrates an enlarged plan view of an example of an embodiment of a plurality of non-rectangular die, such as die 113-116, that are formed on a portion of wafer 30 as identified by a dashed line 112 in FIGS. 1 and 8. Die 113-116 are non-rectangular because a periphery of a top surface of any one of die 113-116 has a triangle shape and not a rectangular shape. A singulation region 119 of wafer 30 surrounds the periphery of each of die 113-116.

Even though the sides of die 113-116 are straight lines, the sides do not meet at right angles. In order to maximize the number of this type of die that can be placed in a given area, such as an area of wafer 30, the die are arranged in a staggered pattern because an extension of one of the sides of one of the die will intersect an adjacent die. For example, extending a side 117 of die 114 would cause the extension to intersect die 113. Also, die 114-115 may be arranged to be non-centric so that the center of die 114-115 along at least one direction do not align. For example, die 113-116 are illustrated with the center of die 114 and 116 aligned along a horizontal line. However, the centers of die 113 and 114 are not aligned along a vertical line even though other die (not shown) of wafer 30 may be aligned with die 114 along the vertical line, but the vertical line trough the center of die 113 would traverse through die 114. Because of the non-rectangular shape or the staggered pattern, singulation region 119 that surrounds die 113-116 does not form a continuous straight line that extends axially across wafer 30. Die 114-116 are also considered to be positioned on wafer 30 in an irregular pattern because An axial singulation line that extends axially across the portion of wafer 30 where die 113-116 are positioned or formed would be extend through the interior of some of die 113-116 and damage the die. Those skilled in the art will understand that die 113-116 may be arranged on wafer 30 in a different pattern that allows the use of an axial singulation line to remove die 113-116.

After forming die 113-116, portions of wafer 30 that surround die 113-116, such as a portion of singulation region 119, are simultaneously removed using a dry etch method in order to singulate die 113-116 into individual die. The removed portions of wafer 30 that typically may be removed are illustrated by crosshatched lines 118.

Previous die singulation methods would require that the distance between the die, such as between the sides of die 114 and 115, would have to be increased to allow a straight continuous singulation line to extend between die 114 and 115. Thus, the position or spacial arrangement of die 114-116 improve wafer utilization and allows for increasing the number of die formed on the wafer.

Figure 9:
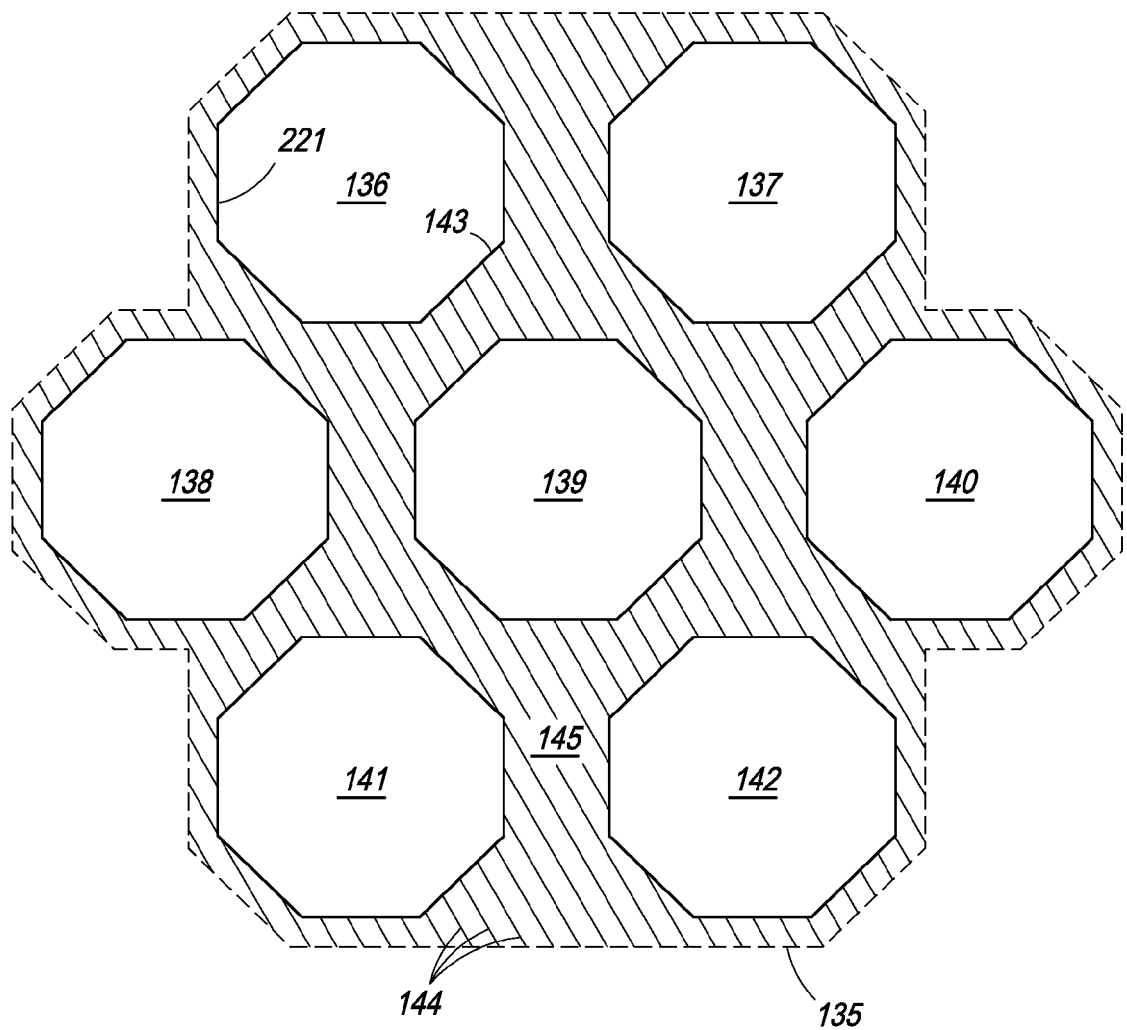

FIG. 9 illustrates an enlarged plan view of an example of an embodiment of a plurality of non-rectangular shaped die, such as die 136-142, that are formed on a portion of wafer 30 as identified by a dashed line 135 in FIGS. 1 and 8. Die 136-142 have a non-rectangular shape, such as an octagon, because the outer periphery of the top surface or plan view of die 136-142 have a non-rectangular shape. The octagon shape is an example of a non-rectangular shape and die 136-142 could have other non-rectangular shapes. A singulation region 145 of wafer 30 surrounds the periphery of each of die 136-142.

In order to maximize the number of non-rectangular shaped die that can be placed in a given area, such as an area of wafer 30. Die 136-142 generally are positioned on wafer 30 in an irregular pattern. In one example of an irregular pattern embodiment, die 136-142 are positioned so that singulation region 145 that surrounds die 136-142 does not form a continuous straight line that extends axially across the portion of wafer 30 where die 136-142 are formed.

Also, die 136-142 have an irregular shape because the shape of the outer periphery of the top surface of the die prevents singulating the die by using an axial singulation line that extends axially in-between one of die 35-42 and an adjacent one of die 35-42. For example an axial singulation line that extends axially through the portion of wafer 30 that is in-between die 136 and 137 can not be used to singulate die 136 because the outer periphery of die 136 has a side 143 that can not be removed by such an axial singulation line. As can be seen, die 136 has other sides that also contribute to this irregular shape. Thus, the irregular shape prevents singulating any one of die 136-142 by using an axial singulation line. Thus, the irregular shape prevents suing axial singulation lines for singulating die 136-142.

Additionally, any of die 136-142 may be positioned in a non-centric position relative to an adjacent die by positioning one die such that the center of the die is not aligned with an adjacent die. Also, die 136-142 may be positioned on wafer 30 in a staggered position relative to an adjacent die. This staggered pattern generally is used because the configuration can increase the number of polygon shaped die that can be formed in a given area of wafer 30. As a result of the staggered pattern, a straight line that extends from any side of one of die 136-142 will traverse through another one of die 136-142. Because of this configuration, die 136-142 cannot be singulated using singulation lines that extend axially across the portion of wafer 30 where die 136-142 are formed. Consequently, singulation region 145 that surrounds die 136-142 does not form a continuous straight line that extends axially across the portion of wafer 30 where die 136-142 are formed.

Additionally, any one of die 136-142 are considered to be arranged on wafer 30 in an irregular pattern because an axial singulation line along one side of one of die 136-142, such as parallel to side 221 of die 136, would intersect interior portions of adjacent die such as die 138. Consequently, some of die 136-142 can not be singulated from wafer 30 using axial singulation lines that extend axially across the portion of wafer 30 where die 136-142 are formed. Therefore, singulation region 145 that surrounds die 136-142 does not form a continuous straight line that extends axially across wafer 30 or even across the portion of wafer 30 where die 136-142 are formed.

Additionally, any one of die 136-142 are considered to be arranged on wafer 30 in an irregular pattern because an axial singulation line that extends axially along one side of one of die 136-142 through at least a portion of a singulation region 145 would intersect interior portions of adjacent die such as die 40. Consequently, some of die 35-42 can not be singulated from wafer 30 using axial singulation lines that extend axially across the portion of wafer 30 that includes the die to be singulated because the irregular pattern would cause such axial singulation lines to traverse through an interior of at least one of the die. Therefore, singulation region 49 that surrounds die 35-42 does not form a continuous straight line that extends axially across the portion of wafer 30 where die 51-56 are positioned.

After forming die 136-142, portions of wafer 30 that surround die 136-142, such as portions of singulation region 145, are simultaneously removed in order to singulate die 136-142 into individual die. The portions of wafer 30 that typically may be removed are illustrated by crosshatched lines 144. Since a simultaneous singulation method is used to remove singulation region 145 or portions thereof, die 136-142 may be formed in the described shapes or arranged and positioned on wafer 30 in a the described configurations and to maximize the use of wafer 30 and increase the number of die that can be formed on wafer 30.

In prior singulation methods that formed straight singulation lines that extended axially across a wafer, the continuous straight singulation line could extend though portions of die 136-142 and damage the die. For example, such a continuous straight singulation line could form a singulation line that would extend from a side of one of the die, such as along side 221 of die 136, though portions of other die, such as through interior portions of die 138, and damage die 138. Alternately, the distance between the die, such as between the sides of die 136 and 138, would have to be increased to allow a straight continuous singulation line to extend between the die thereby decreasing the number of die that may be formed on a wafer.

Figure 10:
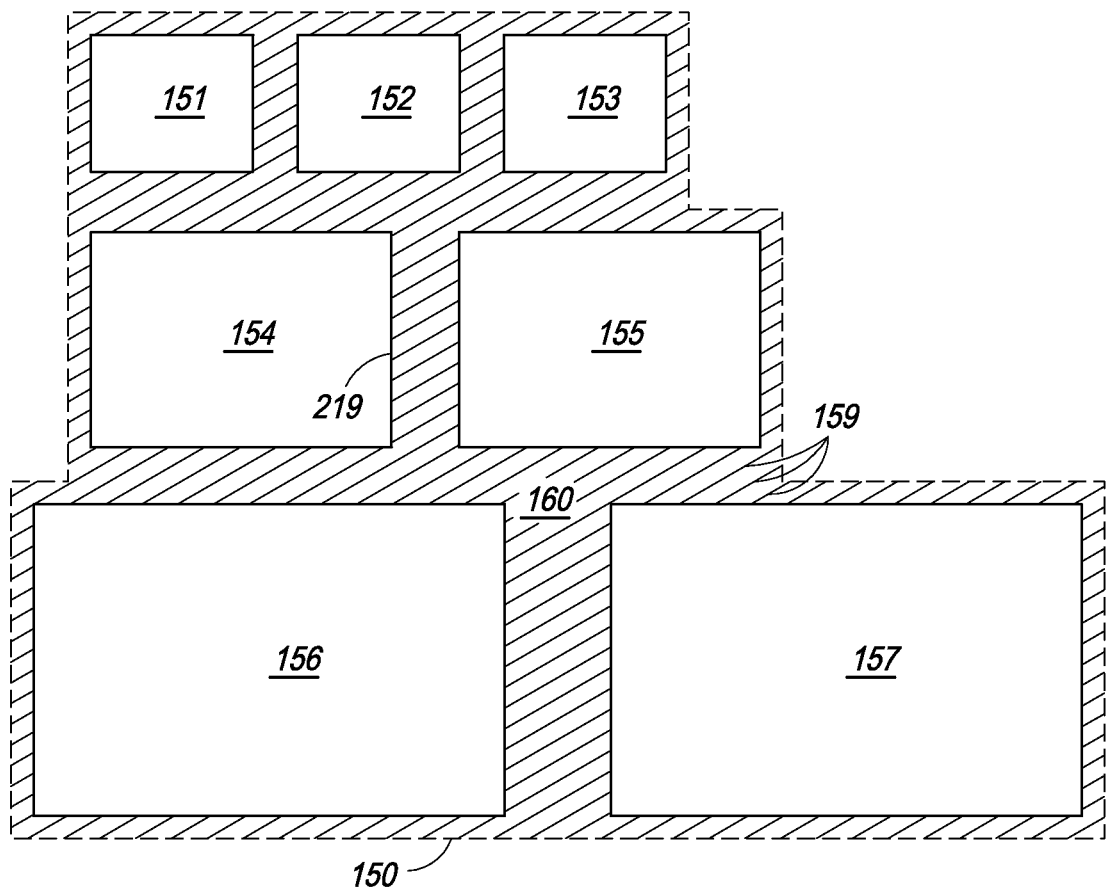

FIG. 10 illustrates an enlarged plan view of an example of an embodiment of a plurality of die, such as die 151-157, that are formed on a portion of wafer 30 as identified by a dashed line 150 in FIGS. 1 and 9. Some of the die, such as die 156 and 157, have an area and distance around the outer periphery of the top surface of the die that are greater than the area and distance around the outer periphery of the top surface of other die of wafer 30, such as die 151 and 154. A singulation region 160 of wafer 30 surrounds the periphery of each of die 151-157. For the example embodiment illustrate in FIG. 10, die 151-157 are illustrated as rectangles. Because the die have different areas and peripheries, the die are arranged in a staggered pattern relative to each other in order to maximize the number of die that can be formed in a given area such as on the surface of wafer 30. Thus, the area of die 151 is not substantially equal to the area of either of die 154 or 156, and the area of die 154 is not substantially equal to the area of die 156. Additionally, die 151-157 are considered to be arranged on wafer 30 in an irregular pattern because a singulation line along one side of one of die 151-157, such as parallel to side 219 of die 154, would intersect interior portions of adjacent die such as die 152 and 156. Consequently, none of die 151-153 or 154-155 or 156-157 can be singulated from wafer 30 using axial singulation lines that extend axially across the portion of wafer 30 where die 151-157 are formed because such axial singulation lines would traverse through at least one of the die. Therefore, singulation region 160 that surrounds die 151-157 does not form a continuous straight line that extends axially across wafer 30 or even across the portion of wafer 30 where die 151-157 are formed.

Since a simultaneous singulation method is used to remove at least portions of singulation region 160, die 151-157 may be arranged and positioned on wafer 30 in a staggered configuration or an irregular pattern that maximizes the use of wafer 30 and increases the number of multiply sized die that can be formed on wafer 30.

One skilled in the art will understand that at least two different die sizes, such as die having the area of die 153 and 155, and that may be only one die that has an area that is different from the area of other die on wafer 30. In some embodiments, the different sized die are singulated from wafer 30 wherein a periphery of the first and second semiconductor die have the same shape, such as a rectangle, and wherein both the first and second semiconductor die are singulated from wafer 30 as two whole intact die. In other embodiments, one of the different sized die may be a test structure that is formed on wafer 30 in order to test processing parameters or other parameters during the manufacturing operation. For such an embodiment the test structure die may not be singulated from wafer 30.

Figure 11:
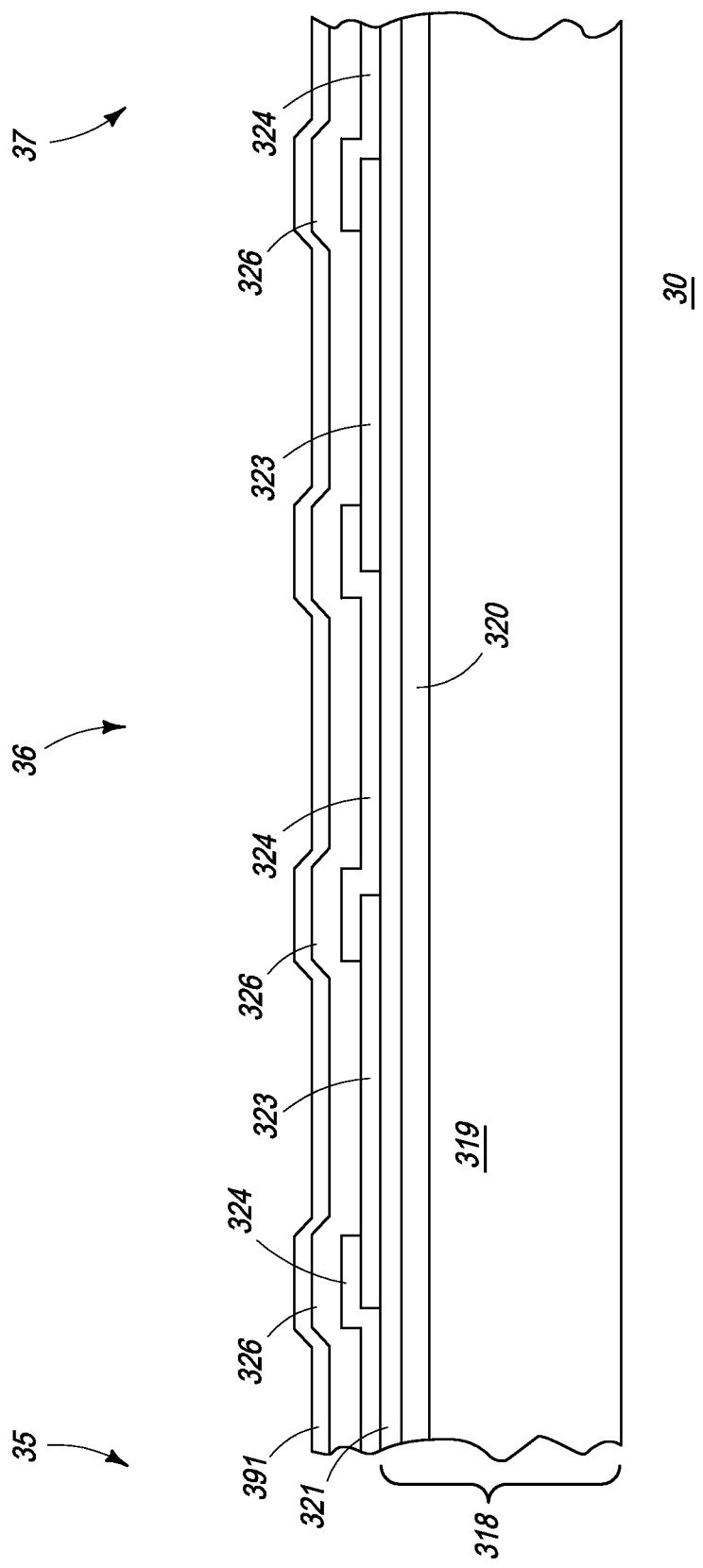
FIG. 11 illustrates an enlarged cross-sectional view of an embodiment of a portion of the semiconductor wafer of FIG. 1 at a stage in an example of an embodiment of a process of singulating die from the wafer in accordance with the present invention.

FIG. 11 illustrates an enlarged cross-sectional portion of wafer 30 of FIG. 1 and FIG. 2 taken along section line 2-2. For clarity of the drawings and of the description, this section line 2-2 is illustrated to cross-section only die 36 and portions of die 35 and 37. Semiconductor die 35-37 generally include a semiconductor substrate 318 that may have doped regions formed within substrate 318 in order to form active and passive portions of the semiconductor die. The cross-sectional portion illustrated in FIG. 11 is taken along a contact pad 324 of each of die 35-37. Contact pad 324 generally is a metal that is formed on the semiconductor die in order to provide electrical contact between the semiconductor die and elements external to the semiconductor die. For example, contact pad 324 may be formed to receive a bonding wire that may subsequently be attached to pad 324 or may be formed to receive a solder ball or other type of interconnect structure that may subsequently be attached to pad 324. Substrate 318 may include a bulk substrate 319 that has an epitaxial layer 320 formed on a surface of bulk substrate 319. A portion of epitaxial layer 320 may be doped to form a doped region 321 that is used for forming active and passive portions of semiconductor die 35, 36, or 37. Layer 320 and/or region 321 may be omitted in some embodiments or may be in other regions of die 35, 36, or 37.

Typically, a dielectric 323 is formed on a top surface of substrate 318 in order to isolate pad 324 from other portions of the individual semiconductor die and to isolate each pad 324 from the adjacent semiconductor die. Dielectric 323 usually is a thin layer of silicon dioxide that is formed on the surface of substrate 318. Contact pad 324 generally is a metal with a portion of contact pad 324 electrically contacting substrate 318 and another portion formed on a portion of dielectric 323. After die 35-37 are formed including the metal contacts and any associated inter-layer dielectrics (not shown), a dielectric 326 is formed over all of the plurality of semiconductor die to function as a passivation layer for wafer 30 and for each individual semiconductor die 35-37. Dielectric 326 usually is formed on the entire surface of wafer 30 such as by a blanket dielectric deposition. The thickness of dielectric 326 generally is greater than the thickness of dielectric 323.

After forming dielectric 326, a singulation mask is formed to facilitate forming openings through substrate 318 without etching underlying layers such as portions of dielectric 326. In the preferred embodiment, the singulation mask is formed from aluminum nitride (AlN). In this preferred embodiment, an AlN layer 391 is formed at least on dielectric 326. Layer 391 generally is applied to cover all of wafer 30.

Figure 12:
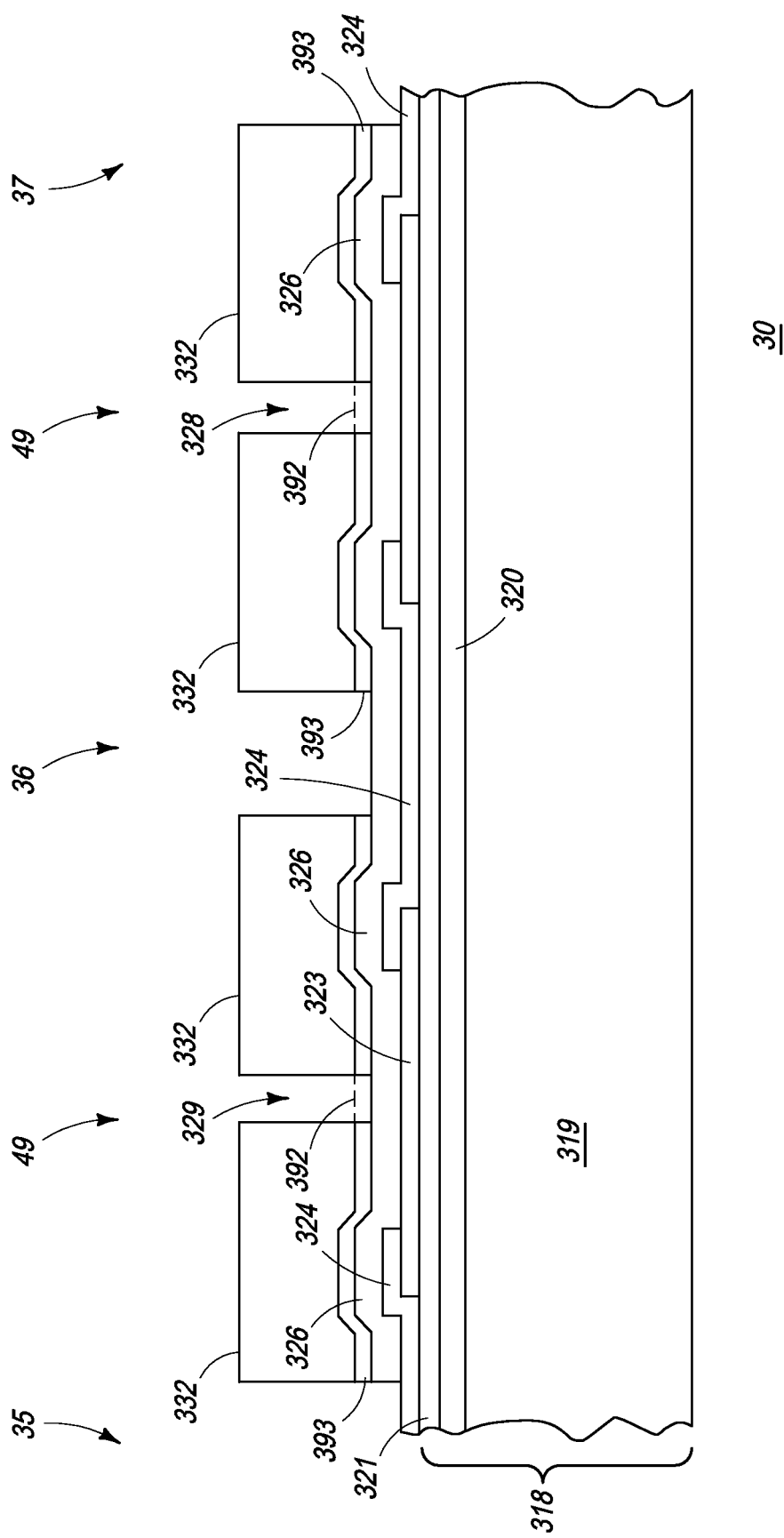
FIGS. 12-14 illustrates the die of FIG. 11 at various subsequent stages in the example of the embodiment of the process of singulating the die in accordance with the present invention.

FIG. 12 illustrates the cross-sectional portion of wafer 30 in FIG. 11 at a subsequent stage in the example of a preferred embodiment of a method of singulating irregular shaped die, such as die 35-37, from wafer 30. After AlN layer 391 is formed, a mask 332 may be applied to the surface of substrate 318 and patterned to form openings that expose portions of dielectric 326 overlying each pad 324 and also overlying portions of wafer 30 where singulation regions, such as singulation region 49, are to be formed.

In order to form mask 332, a photographic mask material is applied to wafer 30 and then exposed to light, such as ultraviolet light, to change the chemical composition of the exposed portion of the mask material in order to form mask 332 having openings overlying the location where the singulation lines are to be formed and also where pads 324 are to be formed. A developer solution is then used to remove the unexposed portions of the mask material thereby leaving mask 332 with openings 328 and 329 overlying the location where respective singulation regions, such as singulation region 49, are to be formed. Those skilled in the art that openings 328 and 329 are typically two portion of a single opening that surrounds die 35-37 but are illustrated as two openings because of the cross-sectional view. It has been found that using an ammonium hydroxide based developer solution also results in the developer solution removing the portion of AlN layer 391 that underlies the unexposed portions of the mask material. The removed portion of layer 391 is illustrated by dashed lines 92, and the remaining portions of layer 391 are identified as AlN 393. AlN 393 functions as a singulation mask as will be seen further hereinafter.

Figure 13:
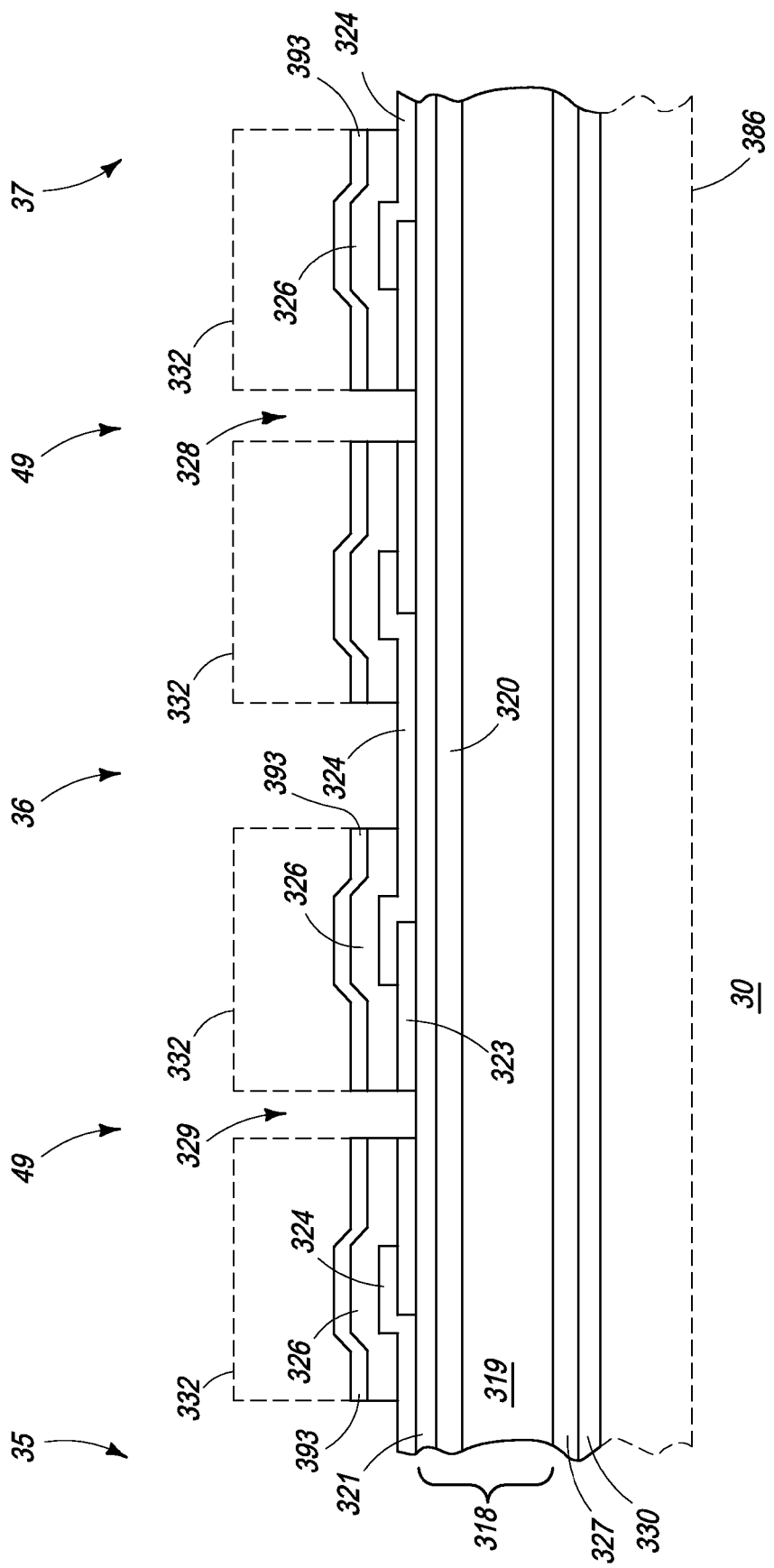

FIG. 13 illustrates the cross-sectional portion of wafer 30 in FIG. 12 at another subsequent stage in the example of the alternate embodiment of the method of singulating die 35-37 from wafer 30. Dielectrics 326 and 323 are etched through the openings in mask 332 and AlN 393 to expose the underlying surface of substrate 318 and pads 324. The openings that are formed through AlN 393 and dielectrics 326 and 323 in the region where the singulation regions, such as region 49, are to be formed function as singulation openings 328 and 329. The openings that are formed through dielectric 326 overlying pads 324 function as contact openings. The etching process preferably is performed with a process that selectively etches dielectrics faster than it etches metals. The etching process generally etches dielectrics at least ten (10) times faster that it etches metals. The metal of pads 324 functions as an etch stop that prevents the etching from removing the exposed portions of pads 324. In the preferred embodiment, a fluorine based anisotropic reactive ion etch process is used, as explained hereinbefore.

After forming the openings through dielectrics 326 and 323, mask 332 usually is removed as illustrated by the dashed lines. Subsequently, substrate 318 generally is thinned to remove material from the bottom surface of substrate 318 and reduce the thickness of substrate 318 as illustrated by dashed lines 386. Generally, substrate 318 is thinned to a thickness that is no greater than about twenty-five to four hundred (25 to 400) microns and preferably is between about fifty to two hundred fifty (50-250) microns. Such thinning procedures are well known to those skilled in the art. After wafer 30 is thinned, the backside of wafer 30 may be metalized with a metal layer 327. This metalization step may be omitted in some embodiments. Thereafter, wafer 30 usually is attached to a transport tape or carrier tape 330 that facilitates supporting the plurality of die after the plurality of die are singulated. In some embodiments, tape 330 may be omitted or replaced by a different carrier device.

Figure 14:
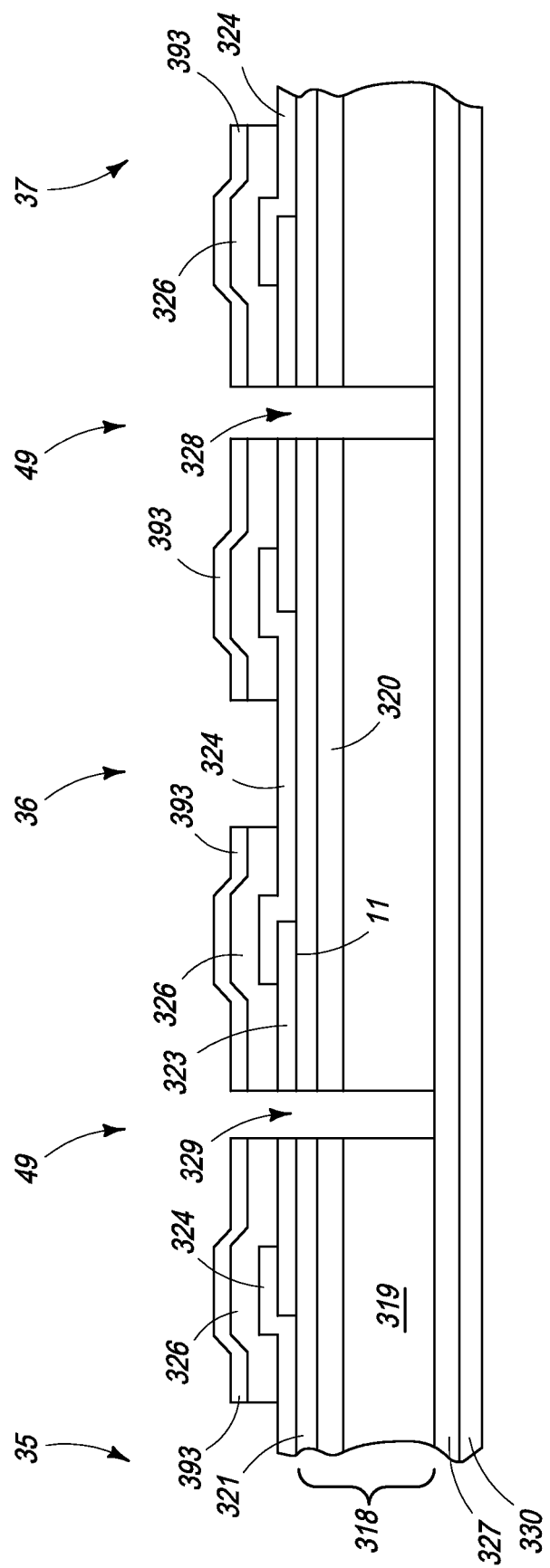

FIG. 14 illustrates wafer 30 at a subsequent stage in the example embodiment of the alternate method of singulating semiconductor die 35-37 from wafer 30. AlN 393 is used as a mask to etch substrate 318 through singulation openings 328 and 329. AlN 393 protects dielectric 326 from being affected by the etching. AlN 393 may have a thickness of about fifty to three hundred (50-300). Angstroms and still protect dielectric 326. Preferably, AlN 393 is about two hundred (200) Angstroms thick. The etching process extends singulation opening 28 and 29 from the top surface of substrate 318 completely through substrate 318 to remove singulation region 49 from wafer 30 and singulate die 35-37. The etching process usually is performed using a chemistry that selectively etches silicon at a much higher rate than dielectrics or metals. The etching process generally etches silicon at least fifty (50) and preferably one hundred (100) times faster than it etches dielectrics or metals. Typically, a deep reactive ion etcher system which uses a combination of isotropic and anisotropic etching conditions is used to etch openings 328 and 329 from the top surface of substrate 318, such as surface 11 of die 36, completely through the bottom surface of substrate 318 in order to form singulation region 49. In the preferred embodiment, a process commonly referred to as the Bosch process is used to anisotropically etch singulation openings 28 and 29 through substrate 18. In one example, wafer 30 is etched with the Bosch process in an Alcatel deep reactive ion etch system.

The width of singulation openings 328 and 329 is generally five to ten (5-10) microns. Such a width is sufficient to ensure that openings 328 and 329 can be formed completely through substrate 318 and are narrow enough to form the openings in a short time interval. Typically, openings 328 and 329 can be extended through substrate 318 as opening 49 within a time interval of approximately fifteen to thirty (15 to 30) minutes. Since all of the singulation regions of wafer 30 are formed simultaneously, all of the singulation regions can be formed across wafer 30 within the same time interval of approximately fifteen to thirty (15 to 30) minutes.

Thereafter, the die of wafer 30 may be supported by carrier tape 330 as the die are taken to subsequent assembly operations.

Because AlN 393 is a dielectric, it may be left on die 35-37. In other embodiments, AlN 393 may be removed after etching through substrate 318 such as by using the developer solution; however, this requires additional processing steps. Using the photo mask developer to remove the exposed portions of layer 391 saves processing steps thereby reducing the manufacturing costs. Using AlN 393 as a mask protects dielectric 326 from being effected by the etching operations.

In other embodiments, the singulation mask may be formed from other materials instead of AlN. Those other materials for the singulation mask are materials that are not substantially etched by the process that is used to etch the silicon of substrate 318. Since the etching procedure used to etch substrate 318 etches silicon faster than metals, a metal compound may be used as the material to form the singulation mask. Examples of such metal compounds included, AlN, titanium nitride, titanium oxide, titanium oxynitride, and other metal compounds. In the example of using a metal compound other than AlN, a layer of the metal compound could be applied similarly to layer 391. Then mask 332 may be used to pattern the metal compound layer to form openings in the metal compound. Thereafter, mask 332 may be removed and the remaining portions of the metal compound could protect underlying layers, such as dielectric 326, during the etching of substrate 318. The metal compounds may be left on the die subsequent to singulation or may be removed prior to complete singulation, such as prior to separating the die from tape 330.

Also a silicon-metal compound may also be used to form the singulation mask because the metal in the metal-silicon compound prevents the etch from proceeding into the metal-silicon material. Some examples of silicon-metal compounds include metal silicides, such as titanium silicide, and cobalt silicide. For the embodiment of a silicon-metal compound, a layer of the silicon-metal compound may be formed and patterned similarly to the example of the metal compound. However, the metal-silicon compound is generally a conductor, so it would have to be removed from the die, such as removing the metal-silicon compound prior to the complete singulation of the die form tape 330.

Also, a polymer may be used for the singulation mask. One example of a suitable polymer is polyimide. Other well-known polymers may also be used. The polymer may be patterned similarly to the metal compound and then may be removed or left on the die.

Figure 15:
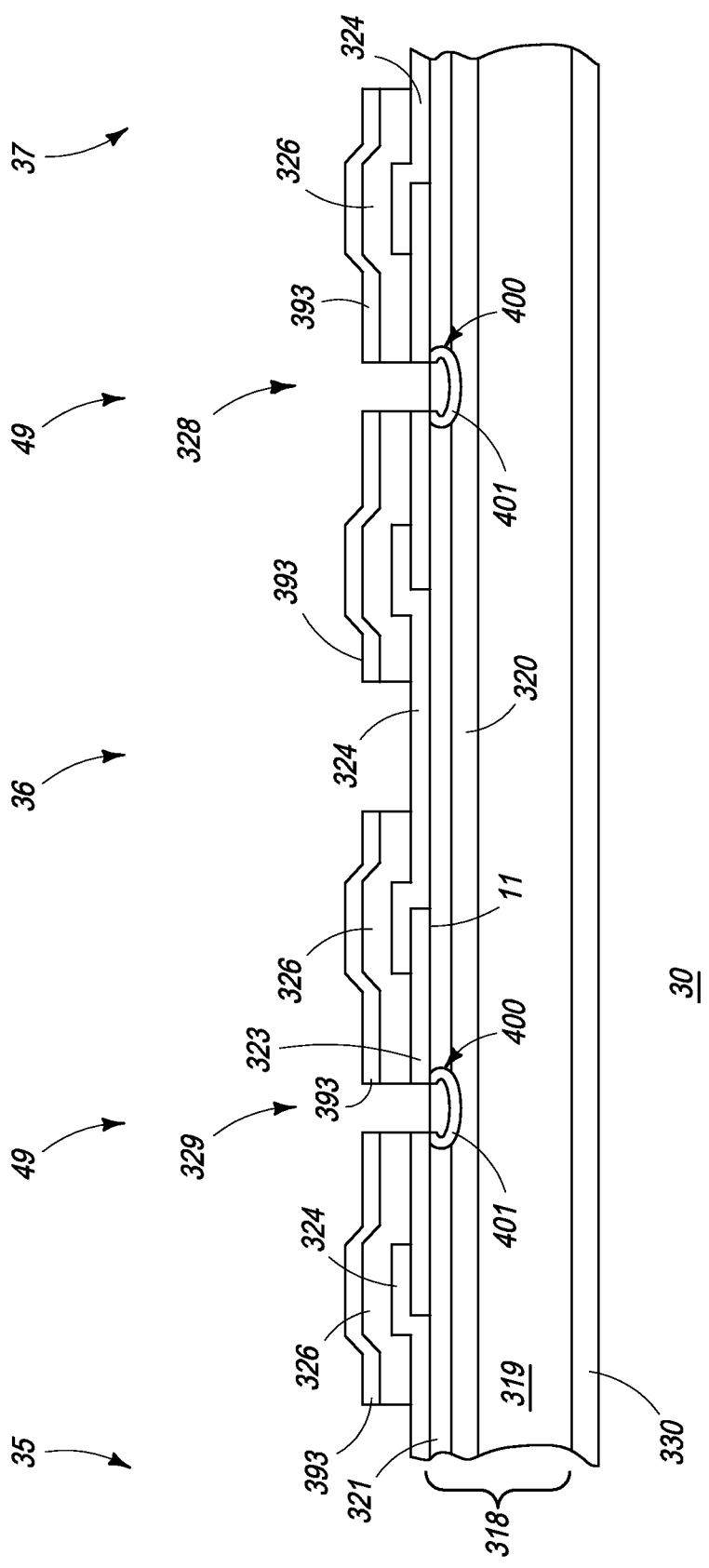
FIG. 15 illustrates an enlarged cross-sectional view of an embodiment of a portion of the semiconductor wafer of FIG. 1 at a stage in an example of another embodiment of a process of singulating die from the wafer in accordance with the present invention.

FIG. 15 illustrates a stage in an example of an embodiment of an alternate method of singulating irregular shaped semiconductor die, such as die 35-37, from a semiconductor wafer, such as wafer 30. The singulation method forms angled sidewalls on the singulated die. The stage illustrated in FIG. 15 starts after forming openings 328-329 as explained in the description of FIG. 12. AlN 393 is used as a mask to etch substrate 318 through singulation openings 328 and 329 and form remove singulation region 49 from wafer 30. Subsequent to exposing the surface of substrate 318, substrate 318 and any exposed pads 324 are etched with an isotropic etching process that selectively etches silicon at a much higher rate than dielectrics or metals, generally at least fifty (50) and preferably at least one hundred (100) times faster. Typically, a down-stream etcher with a fluorine chemistry is used for the etch. For example, wafer 30 may etched in an Alcatel deep reactive ion etch system using full isotropic etching. The etch process is performed to extend openings 328 and 329 into substrate 318 to a depth that extends the width of the openings laterally while also extending the depth to form an opening 400 in substrate 318. Because the process is used to form angled or sloped sidewalls for die 35-37, multiple isotropic etches will be used to successively increase the width of openings 328 and 329 as the depth of the openings extends into substrate 318. The isotropic etch is terminated after the width of opening 400 is greater than the width of openings 328 and 329 at a surface 11 of die 36 and substrate 18.

Thereafter, a carbon based polymer 401 is applied to the portion of substrate 318 that is exposed within opening 400.

Figure 16:
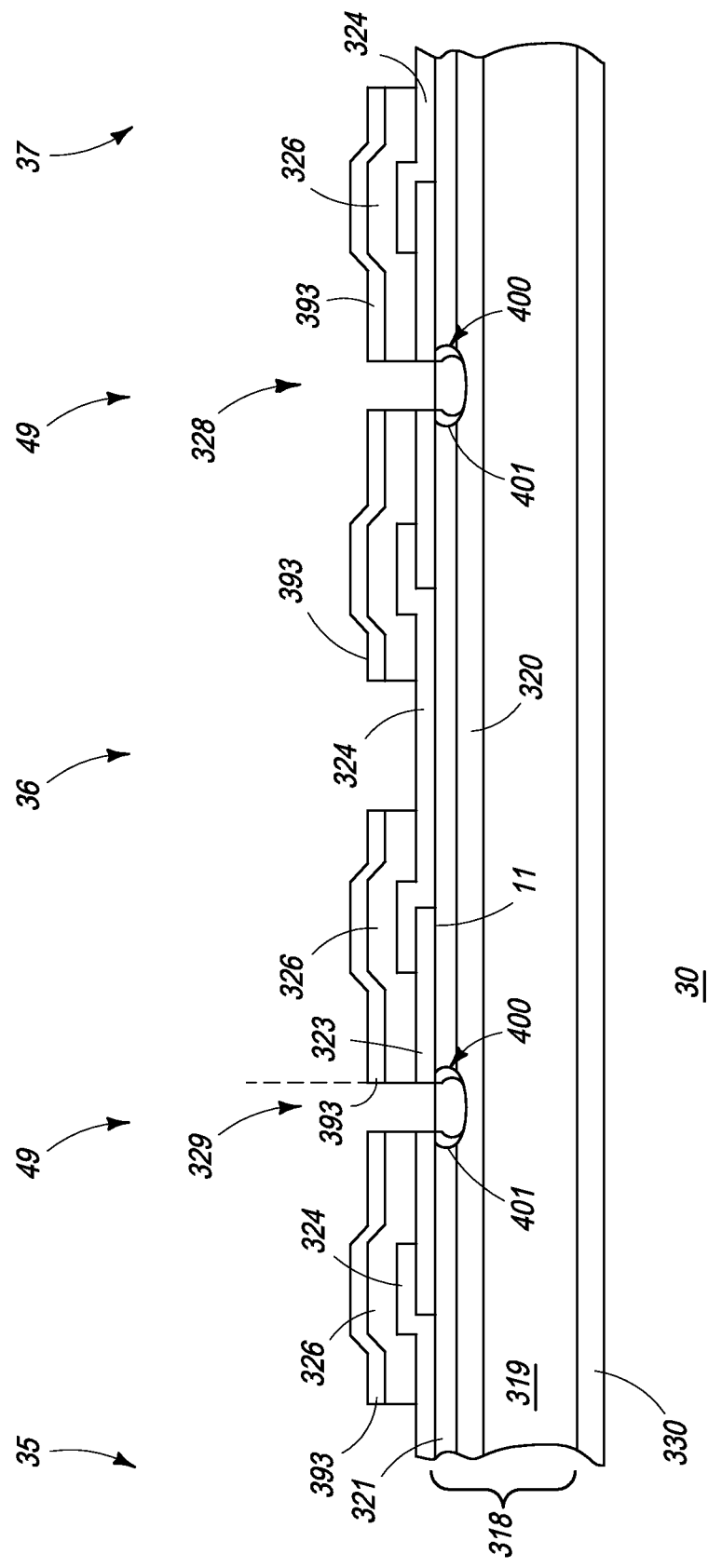
FIGS. 16-19 illustrates the die of FIG. 15 at various subsequent stages in the example of the embodiment of the process of singulating the die in accordance with the present invention.

FIG. 16 illustrates a subsequent stage to the stage explained in the description of FIG. 15. An anisotropic etch is used to remove the portion of polymer 401 that is on the bottom of opening 400 while leaving the portion of polymer 401 on the sidewalls of opening 400.

Figure 17:
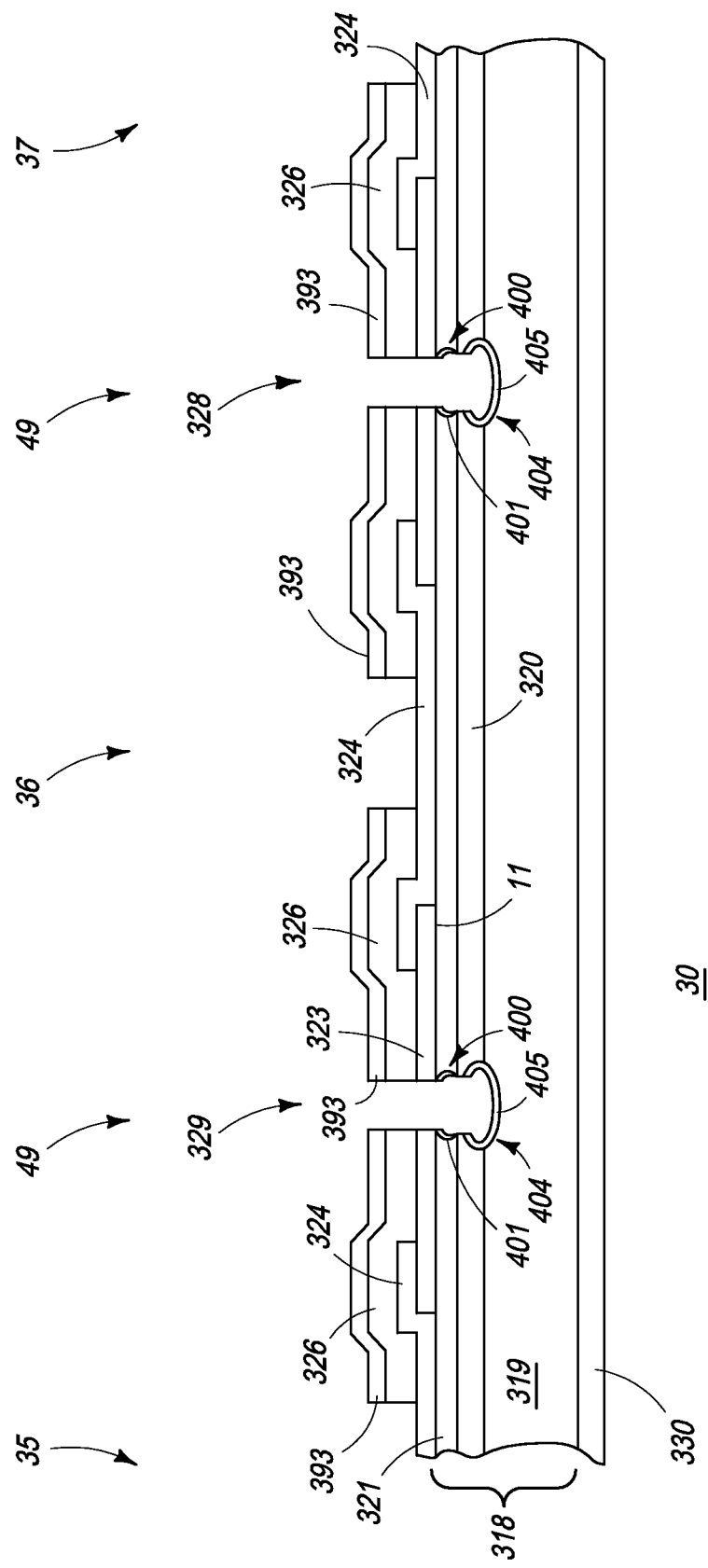

FIG. 17 illustrates a subsequent stage to the stage explained in the description of FIG. 16. The exposed surface of substrate 318 within opening 400, and any exposed pads 324, are etched with an isotropic etching process similar to the one describe in the explanation of FIG. 15. The isotropic etching again extends the width of singulation openings 328 and 329 laterally while also extending the depth to form opening 404 in substrate 318. The isotropic etch usually is terminated after the width of opening 404 is greater than the width of opening 400 in order to make the width of the openings wider as the depth increases. The portion of polymer 401 that was left on the sidewalls of opening 400 protects the sidewalls of opening 400 to prevent the etching of opening 404 from affecting the width of opening 400. Typically, substantially all of polymer 401 is removed from the sidewalls of opening 400 during the etching of opening 404.

Thereafter, a carbon based polymer 405 that is similar to polymer 401 is applied to the portion of substrate 318 that is exposed within opening 404. During the formation of polymer 405, the operation usually forms polymer 401 again on the sidewalls of opening 400.

Figure 18:
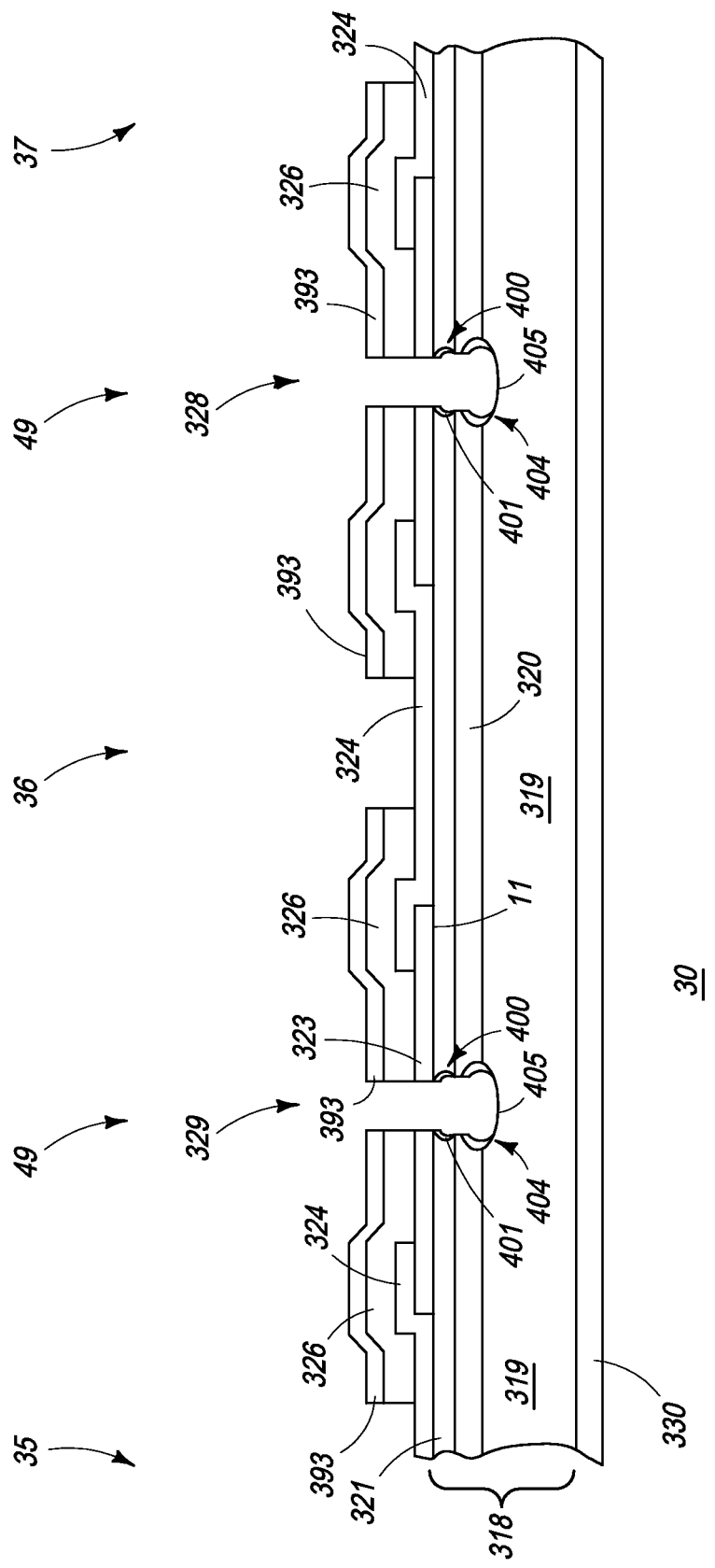

FIG. 18 illustrates a subsequent stage to the stage explained in the description of FIG. 17. An anisotropic etch is used to remove the portion of polymer 405 that is on the bottom of opening 404 while leaving the portion of polymer 405 on the sidewalls of opening 404. This process step is similar to the step explained in the description of FIG. 16.

Figure 19:
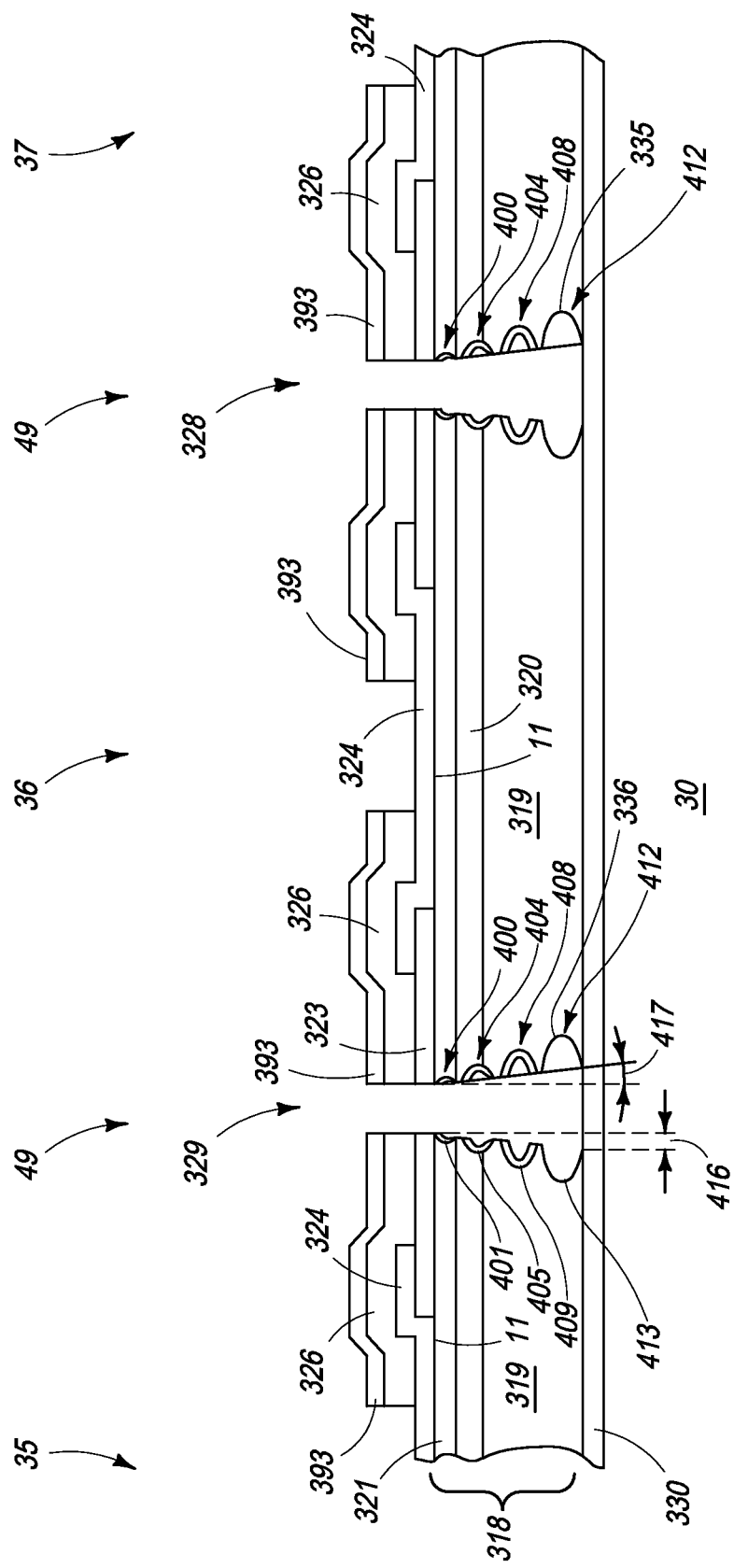

FIG. 19 illustrates that the sequence may be repeated until singulation region 49 is formed to extend completely through substrate 318. The sequence of anisotropic etching to form an opening (such as openings 408 and 412), forming a polymer on the sidewalls of the opening (such as polymer 409, and removing the polymer from the bottom of the openings while leaving a portion of the polymer on the sidewalls (such as polymer 409) can be repeated until openings 328 and 329 are extended through substrate 318 to remove singulation region 49 from substrate 30.

After the last isotropic etch, such as the etch to form opening 412, the polymer usually is not deposited because it generally will not be needed to protect substrate 318 during subsequent operations. Although polymers 401, 405, and 409 are illustrated on the sidewalls of respective openings, 400, 404, and 408, after the completion of all operations, those skilled in the art will appreciate that the last isotropic etch step, such as the etch that forms opening 412, substantially removes these polymers from the sidewalls of the corresponding openings. Thus, these polymers are shown only for clarity of the explanation.

As can be seen from FIG. 19, sidewalls 336 of die 35 and sidewalls 335 and 337 of respective die 35 and 37 slope inwardly from top surface 11 to the bottom so that the width of the die at the bottom of each die is less than the width of the die at the top of the die. Thus, the outside edge, of the die at the top of substrate 318 extends a distance 316 past the outside edge of the die at the top of substrate 318, thus, the top surface of die 35 overhangs the bottom surface by distance 316. It is believed that distance 316 should be approximately five to ten percent (5-10%) of the thickness of die 35-37. In one example embodiment, distance 316 is approximately one to five (1-5) microns, thus the width of the bottom of die 35 at the bottom of substrate 318 could be approximately two to ten (2-10) microns less than the width at the top of die 35 at surface 11. Generally, the top of the opening of singulation region 49 is about two to forty (2-40) microns narrower than the bottom of the opening of singulation region 49. In another embodiment, it is believed that sidewall 336 should form an angle 417 of approximately fifteen to forty degrees (15°-40°) between sidewall 336 and a vertical line, such as a line perpendicular to the top surface of substrate 318. Therefore, the amount that each etch extends the width of opening 329 should be sufficient to form angle 417. Those skilled in the art will appreciate that the multiple anisotropic etch operations forms a rough sidewall of each die 35-37 so that the sidewall has a jagged edge along the sidewall. However, the extent of the jagged edges is exaggerated in the illustrations of FIGS. 15-19 for clarity of the explanation. These sidewalls are generally regarded as substantially smooth sidewalls.

Those skilled in the art will appreciate that in another alternate embodiment of the method of singulating die 35-37, the singulation mask layer may be omitted. In such a case, the isotropic and/or anisotropic etch procedures use an etch that etches silicon faster than dielectrics or metals, thus, dielectric 326 provides protection for underlying portions of each of die 35-37. See United States patent publication no. 2009/0042366 of inventor Gordon M. Grivna that was published on Feb. 12, 2009.

Figure 20:
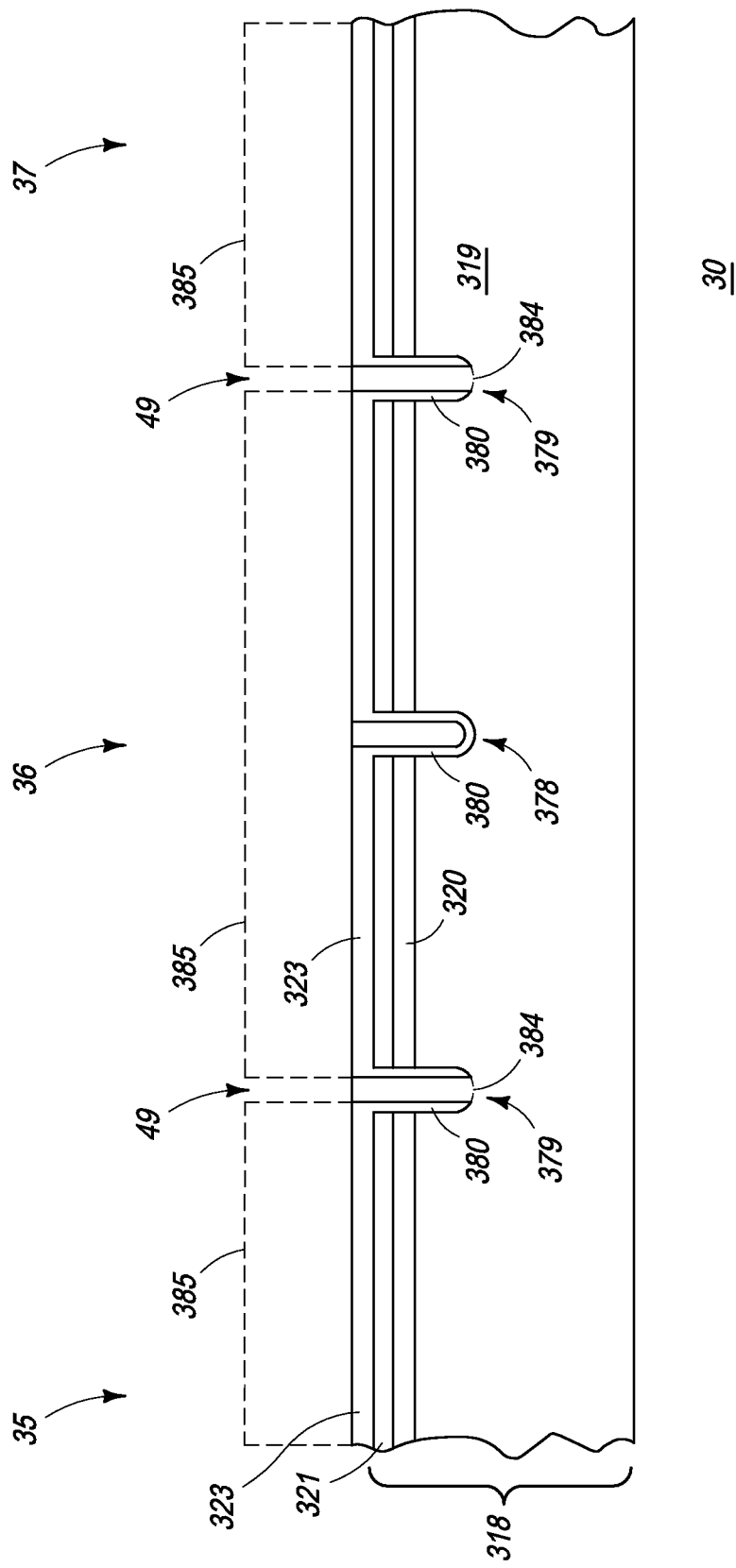
FIG. 20 illustrates an enlarged cross-sectional view of an embodiment of a portion of the semiconductor wafer of FIG. 1 at a stage in an example of another embodiment of a process of singulating die from the wafer in accordance with the present invention.

FIG. 20 illustrates a stage in an example embodiment of another alternate method of singulating irregular semiconductor die, such as 35-37, form a semiconductor wafer, such as wafer 30. FIG. 20 illustrates an enlarged cross-sectional portion of die 35-37 at a manufacturing state after forming dielectric 323 on the top surface of substrate 318 and prior to forming pads 324 (FIG. 11). For the example singulation method illustrated in FIG. 20, die 35-37 have a single isolation trench 379 that surrounds each die on wafer 30. As will be seen further hereinafter, trench 379 will be used to form singulation region 49 and remove region 49 from wafer 30.

Trench 379 is formed as an opening into substrate 30 and a dielectric liner 380 is on formed on the sidewalls and bottom of the opening. The dielectric liner generally is a dielectric material such as silicon dioxide. The remainder of the opening is generally filled with a filler material 381. In the preferred embodiment, the bottom of dielectric liner 380 is removed so that the bottom of trench 379 is open as illustrated by a dashed line 384. One example method of removing the bottom of liner 380 includes applying a mask 385 having openings that exposes trench 379 and performing an isotropic etch, such as a spacer etch, that etches through the bottom of liner 380. The etch may be selective to dielectrics over silicon in order to prevent damaging the portion of substrate 318 that is underlying trench 379. Mask 385 generally is removed after the bottom of liner 380 is removed. After removing the bottom of trench 379, the remaining opening of trench 379 is filled with the filler material 381. Filler material 381 generally is a silicon based material, such as polysilicon, in order to facilitate subsequent process steps as will be seen further hereinafter.

Those skilled in the art will appreciate that any of die 35-37 may also have other trenches, such as a trench 378, internal to the die and that these trenches may be formed using process operations similar to those used to form trench 379. Trench 378 may retain the bottom oxide or have the bottom oxide removed depending upon the function that it will serve. For example, trench 378 may be filled with doped polysilicon and provide a low resistance substrate contact or a backside contact such as to metal layer 327 (not, shown in FIG. 20) or to another contact on the bottom or backside of substrate 318. However, the preferred embodiment of trench 378 does not have the bottom removed and trench 378 preferably is internal to the die and does not surround the outside perimeter of the die. Thus, trench 379 may be formed at the same time as trench 378, or other similar trench, thereby reducing manufacturing costs. As will be understood by those skilled in the art; die 35-37 may have various active and or passive elements formed on or within substrate 318.

Trench 379 is formed within singulation region 49 and preferably in the middle of the singulation region such that at any point of region 49, the middle of trench 379 is approximately in the middle of region 49 such as the mid point between two die. As will be seen further hereinafter, singulation will occur approximately through the middle of trench 379.

Figure 21:
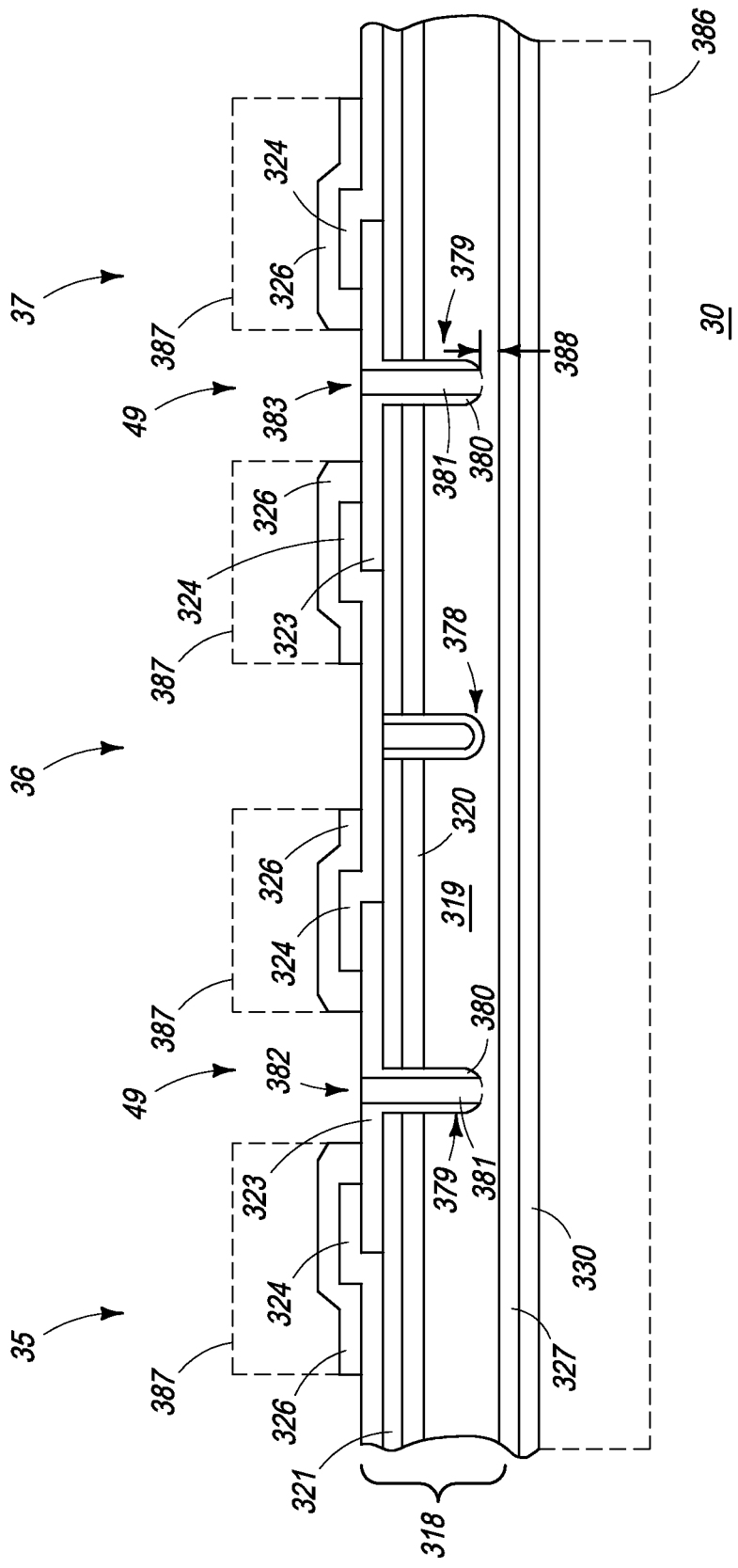
FIGS. 21-22 illustrates the die of FIG. 20 at various subsequent stages in the example of the embodiment of the process of singulating the die in accordance with the present invention.

FIG. 21 illustrates wafer 30 at a subsequent stage in the example method of singulating semiconductor die 35-37 from wafer 30. After trench 379 is formed, other portions of die 35-37 are formed including forming contact pads 324 and forming dielectric 326 covering die 35-37. Dielectric 326 generally also covers other portions of wafer 30 including the portion of substrate 318 where singulation regions, such as region 49, are to be formed. Thereafter, a mask 387 is applied and patterned to expose underlying dielectric 326 where singulation region 49, and contact openings are to be formed. Mask 387 is similar to mask 332 that is illustrated in FIG. 12; however, mask 387 usually has a slightly different position. The openings in mask 387 where singulation region 49 is to be formed also overlie trench 379. Dielectric 326 is etched through the openings in mask 387 to expose underlying filler material 381 that is within trench 379. The etching also typically exposes underlying pads 324. The openings that are formed through dielectric 326 in the region where the singulation region, such as region 49, is to be formed function as singulation openings 382 and 383. The etching process used to form openings 382 and 383 through dielectric 326 is generally the same as the process used to form openings 328 and 329 (FIG. 12) in dielectric 323 and 326. Openings 382 and 383 typically are formed so that dielectric liner 380 on the sidewalls of corresponding trench 379 is underlying openings 382 and 383, although dielectric liner 380 does not have to be exposed as long as material 381 is exposed. Those skilled in the art that openings 382 and 383 are typically two portion of a single opening that surrounds die 35-37 but are illustrated as two openings because of the cross-sectional view.

After forming openings 382 and 383 through dielectrics 326 and 323, mask 387 is removed, as illustrated by the dashed lines, and substrate 318 is thinned as illustrated by a dashed line 386. The thinning removes most of substrate 318 that is underlying trench 379. Substrate 318 generally is not thinned all the way up to the bottom of trench 379 because the dielectric material of dielectric liner 380 may damage the tool used to thin wafer 30 or may result in scratching wafer 30. Preferably, substrate 318 is thinned until trench 379 is about two to five (2-5) microns from the bottom to substrate 318. In some embodiments, substrate 318 may be thinned until the bottom of trench 379 is exposed. Thereafter, the bottom surface of substrate 318 may be metalized with metal layer 327 as explained hereinbefore in the description of FIG. 13. This metalization step may be omitted in some embodiments. Subsequently, wafer 30 is usually attached to a common carrier substrate or common carrier, such as carrier tape 330.

Figure 22:
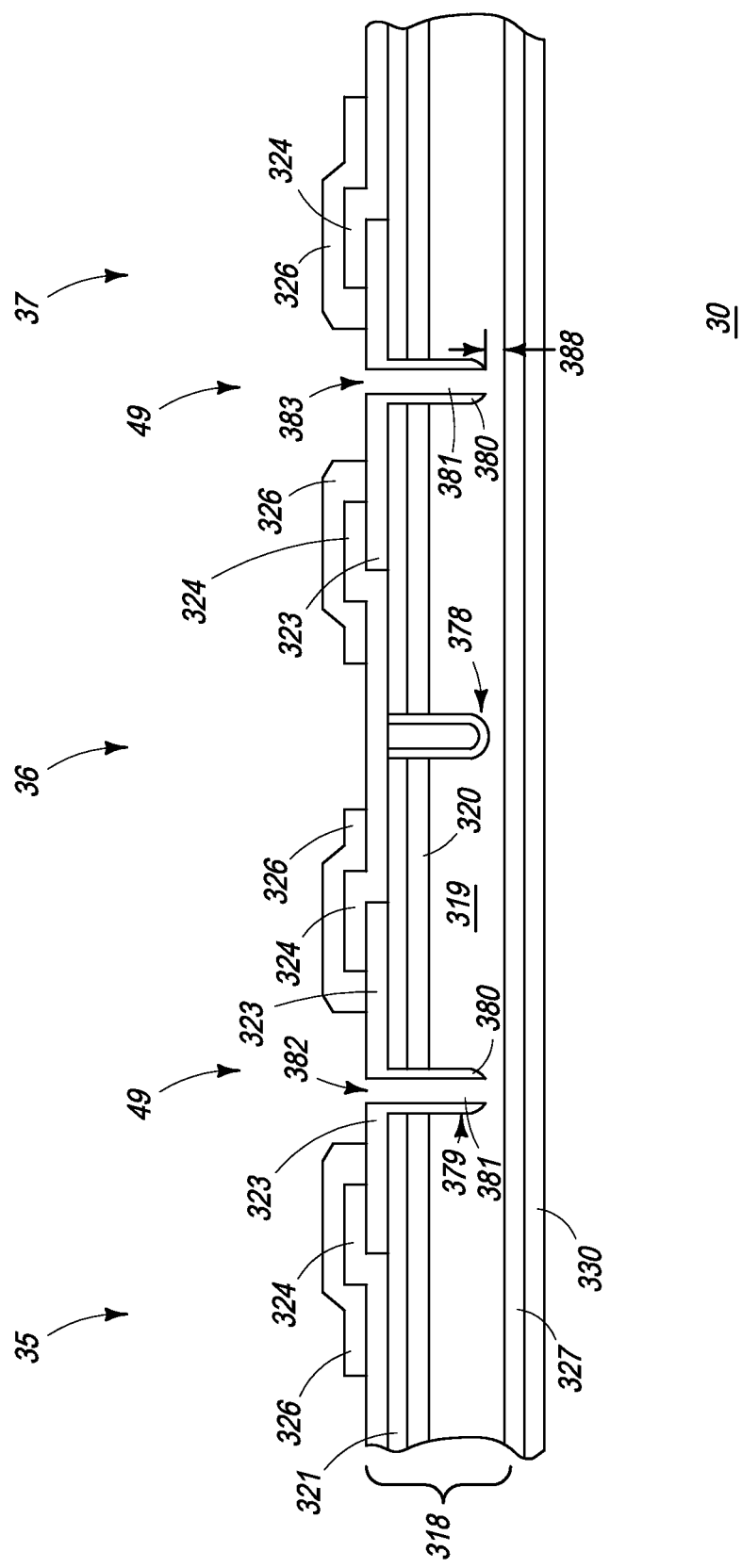

FIG. 22 illustrates wafer 30 at a subsequent stage in an example of an embodiment of an alternate method of singulating die 35-37 from wafer 30. A second opening is formed through filler material 381 to form region 49 as an opening through substrate 318. Substrate 318 preferably is etched through singulation openings 382 and 383 using dielectric 326 as a mask. The etching process usually is performed using a chemistry that selectively etches silicon at a much higher rate than dielectrics or metals similar to the etching explained in the description of FIG. 14. The etching process forms an opening through material 381. Typically, the etching removes substantially all of material 381 to extend singulation region 49 from the top surface of substrate 318 completely through filler material 381 of trench 379 and remove region 49 from wafer 30. Since the etching step is selective to silicon over dielectrics, filler material 381 is removed without etching dielectric liner 380 on the sidewalls of trench 379. Thus, dielectric liner 380 on the sidewalls of trench 379 protects the silicon of substrate 318 from the isotropic etch. The isotropic etch has a much higher etching throughput than can be obtained with the use of the BOSCH process or with limited use of the Bosch process. The isotropic etching process etches through filler material 381 and any portion of substrate 318 that underlies trench 379. Thus, the isotropic etch quickly etches through trench 379 and any underlying portion of substrate 318 thereby singulating die 35-37. The rapid etching improves throughput and reduces the manufacturing costs. Those skilled in the art will appreciate that the silicon based material of filler material 381 also reduces stress on the material of dielectric liner 380 and substrate 319.

Singulating die 35-37 along singulation region 49 through trench 379 results in the singulation region occupying a very small space of a semiconductor wafer. For example, the width of trench 379 including filler material 381 typically is only about three (3) microns wide. Thus, singulation region 49 may be only about three microns wide instead of one hundred microns wide in other methods of singulating die, such as scribing or wafer sawing. It will be apparent to those skilled in the art that the step of thinning wafer 30 may be omitted and the etching of material 381 may be continued until openings 382 and 383 are extended through wafer 30.

Those skilled in the art will appreciate that layer 391 and AlN 393 may be used as the singulation mask as described in the explanation of FIGS. 10-13.

Figure 23:
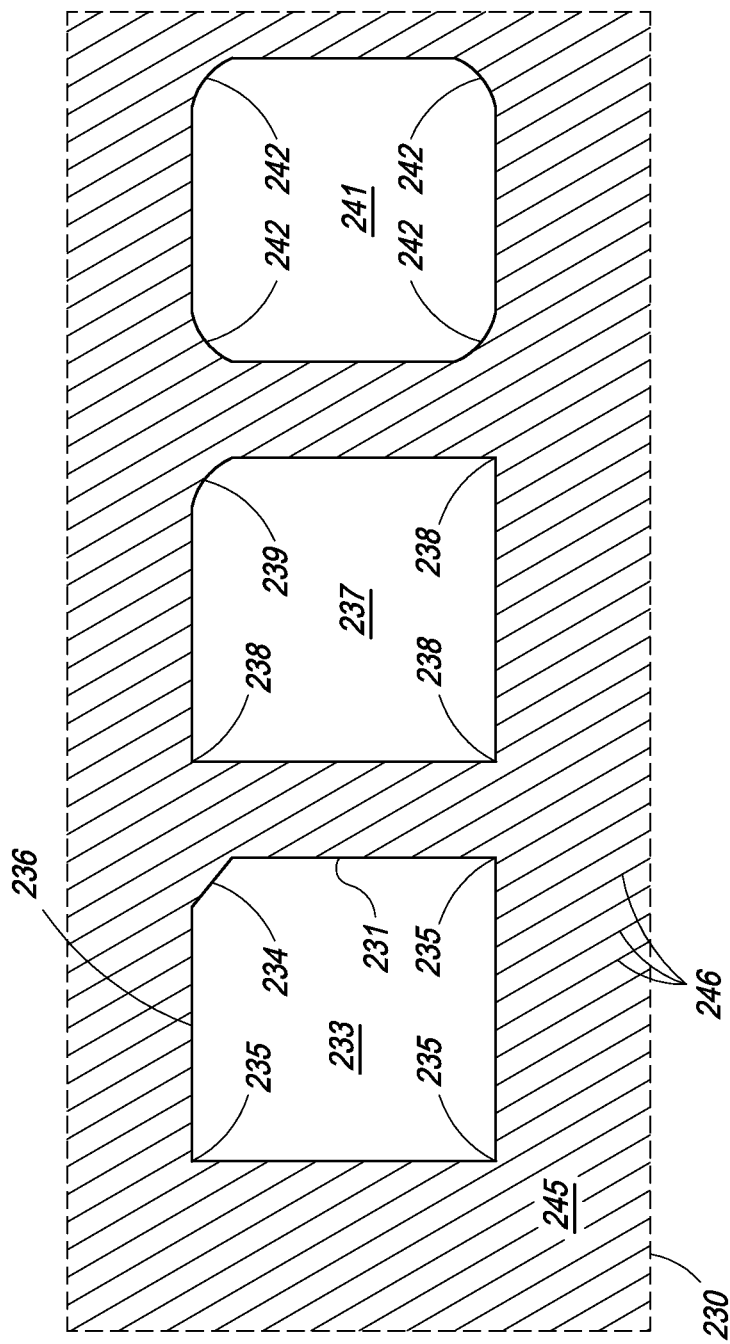
FIG. 23 illustrates an enlarged plan view of an example of an embodiment of a plurality of die of the wafer of FIG. 1 in accordance with the present invention.

FIG. 23 illustrates an enlarged plan view of an example of an embodiment of a plurality of non-rectangular shaped die, such as die 233, 237, and 241, that are formed on a portion of wafer 30 as identified by a dashed line 230 in FIGS. 1 and 23. Die 233, 237, and 241 have corners that do not intersect at a right angle. Die 233 has a corner 234 that is formed as a diagonal that has a straight line that runs diagonally from side 236 to side 231. Thus, the corner is a diagonal instead of a right angle. The diagonal portion of corner 234 may be used as an alignment key for die 233 to identify corner 234 from the right angle of corners 235. The alignment key facilitates orienting die 233 during manufacturing operations to attach die 233 to a substrate or a package.

Die 237 has corners 238 that form a right angle and a corner 239 that has a curved shape. The curved shape reduces stress at the corner thereby improving the reliability of die 237 over die that have right angled corners. In some embodiments corner 239 may also be used as an alignment key since it is different from corners 238. Although corner 239 is illustrated as a convex curved shape, corner 239 may have any type of curved shape.

Die 241 has all of corners 242 formed as a curved shape. The curved shape reduces stress and improves the reliability of die 241.

Those skilled in the art will appreciate that die 233 and 237 are formed as die that have one corner, such as corners 234 and 239, that has a shape that is different from the other corners of the die. The shape of corners 234 and 239 are used to illustrate examples of different corner shapes that may be used, however, the corner shape is not limited to a curve of a diagonal corner but any corner may be different than any other corner of a die in order to form an alignment key that identifies one corner of the die. Additionally, the other corners, such as corners 235, do not have to be right angles but can be any shape that is different from the identifying corner, such as corner 234.

As well as being non-rectangular, die 237 and 241 have an outer periphery of the singulated die that has a shape having at least one curved portion.

Those skilled in the art will appreciate that the explanations included herein teach one skilled in the art a method of forming a semiconductor die comprising: a periphery of a top surface of the semiconductor die, such as one of any die in FIGS. 2-10 and 23, having a shape that is one of a non-rectangular, multiply-connected, having protrusions extending outwardly along the periphery, an asymmetrical shape, or having at least one curved portion.

One skilled in the art can also see that a non-rectangular shape may include one of a triangle shape, a parallelogram shape, a shape having the protrusions extending outwardly along the periphery, a multiply-connected shape, or a shape wherein a portion of the periphery has a curved shape.

The skilled artisan will also appreciate that the semiconductor die may have one corner that has a different shape than other corners, for example as illustrated by die 233, or that the semiconductor die may have at least one corner with a curved shape, for example as illustrated by die 237 or 241.

One skilled in the art will also appreciate that a method of forming a semiconductor die may include forming a plurality of semiconductor die on a top surface of a semiconductor wafer wherein two or more die of the plurality of semiconductor did have a periphery that is one of a non-rectangular shape, a shape having at least one protrusion along the periphery, a multiply connected shape, a shape having at least one curved portion, an asymmetrical shape, different values for a distance around the periphery for example as illustrated by die 34-42 151-157, or an irregular shape, for example as illustrated by die 34-42, 51-56 86-91, 71-74 136-142, wherein the irregular shape prevents singulating the irregular shape by using a singulation line that extends axially across the semiconductor wafer; forming a singulation region as a region of the semiconductor wafer that is between the semiconductor die; and using a dry etch to simultaneously singulate the plurality of semiconductor die.

The skilled artisan will also appreciated that a method of forming a semiconductor die may include forming a plurality of semiconductor die on a top surface of a semiconductor wafer wherein at least two semiconductor die of the plurality of semiconductor die are arranged in an irregular pattern that prevents singulating the plurality of semiconductor die by using an axial singulation line that extends only axially across a portion of the semiconductor wafer where the plurality of semiconductor die are formed, for example the patterns formed by die 151-157 34-42 51-56 86-91 99-102 124-127114-115 136-142; and using a dry etch to simultaneously singulate the plurality of semiconductor die.

Figure 24:
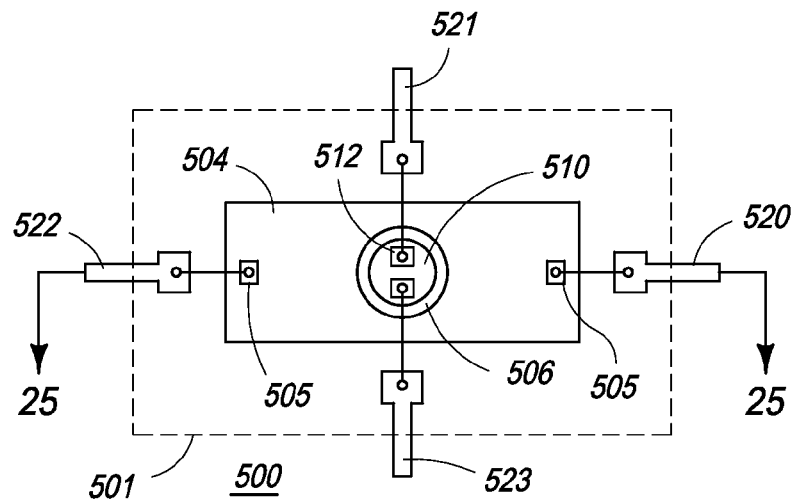
FIG. 24 illustrates a plan view of an embodiment of an example of a semiconductor device having a semiconductor die having a receptacle in accordance with the present invention.

FIG. 24 illustrates a plan view of an embodiment of an example of a semiconductor device 500 that includes a semiconductor die 504.

Figure 25:
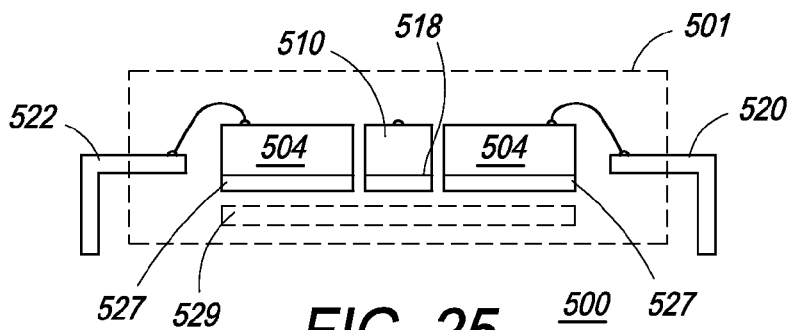
FIG. 25 illustrates a cross-sectional view of the device of FIG. 24 in accordance with the present invention.

FIG. 25 illustrates a cross-sectional view of device 500 along a cross-section line 25-25 of FIG. 24. This description has references to FIG. 24 and FIG. 25. Die 504 is formed to have a receptacle 506 for receiving another component 510. Component 510 may be another active electrical component such as a semiconductor die, or an active electrical component that is not formed on a semiconductor substrate such as a gallium nitride light emitting diode, or a passive electrical component such as a resistor, a capacitor, an inductor, or may be another type of component such as a heat sink that improves the power dissipation of die 504 a mold lock or an alignment pin or an alignment key or other type of orientation element. For example, die 504 may be mated to a package or other device that has an alignment pin or orientation element that only allows die 504 to be in one orientation to fit with the mating device.

In one example, component 510 may be a semiconductor die and receptacle 506 may be an opening through die 504. For this embodiment, component 510 along with die 504 may be encapsulated in a semiconductor package 501, such as a package having a plastic package body. Package 501 may include a lead-frame that has a plurality of connection terminals and a plurality of leads 520-523. Some of leads 520-523, such as leads 520 and 522, may be electrically connected to die 504 and other leads, such as leads 521 and 523, may be electrically connected to the semiconductor die of component 510. The lead-frame of package 501 may also include a flag 527 to which die 504 may be attached and another flag 528 to which the semiconductor die of component 510 may be attached. In another embodiment, die 504 and the semiconductor die of component 510 may be attached to one flag as illustrated by the dashed lines in FIG. 25. The electrical connections between leads 520-523, die 504, and component 510 may be any type of connections that are known in the art such as wirebonds, lead clips, ribbon bonds, etc. Component 510 usually includes connection pads, such as pads 512, that facilitate forming electrical connection to component 510.

Figure 26:
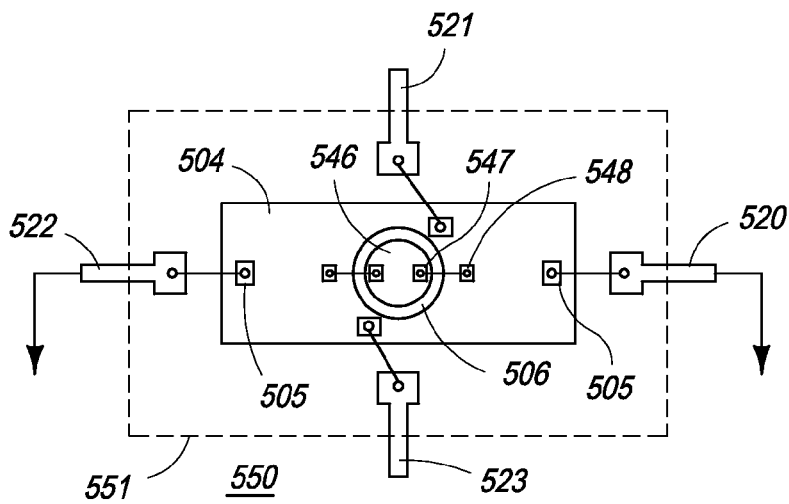
FIG. 26 illustrates a plan view of an embodiment of an example of a semiconductor device that is an alternate embodiment of device of FIG. 24 in accordance with the present invention.

FIG. 26 illustrates a plan view of an embodiment of an example of a semiconductor device 550 that is an alternate embodiment of device 500 of FIG. 24. For this embodiment, die 504 has a component 546 in receptacle 506. Component 546 may be similar to component 510. In this embodiment, component 546 is a semiconductor die that includes connection pads 547 that facilitate forming electrical connections to component 546. Component 546 may be electrically connected to die 504 instead of electrically connected to leads 521 and 523 as illustrated in FIG. 24. In other embodiments, components 510 or 546 may have some connections to die 504 and other connections to some of leads 520-523. Component 546 is similar to component 510.

Positioning the semiconductor die of the example embodiment of component 510 or 546 within receptacle 506 facilitates placing two different types of semiconductor die within one package. The arrangement of component 546 facilitates forming short electrical connections between two semiconductor die that can not usually be formed on one semiconductor substrate. For example, a silicon semiconductor die and a gallium arsenide die, or a power semiconductor die and a logic semiconductor die that is used to control the power semiconductor.

Those skilled in the art will appreciate that although die 504 is illustrated as a rectangular multiply-connected die, die 504 may be any of the die explained in the description of FIGS. 2-10 and 23. Also, receptacle 506 may be any of a protrusion or a curved shape of the periphery of a die or an opening of a multiply-connected die similar to those explained in the description of FIGS. 2-6.

Figure 27:
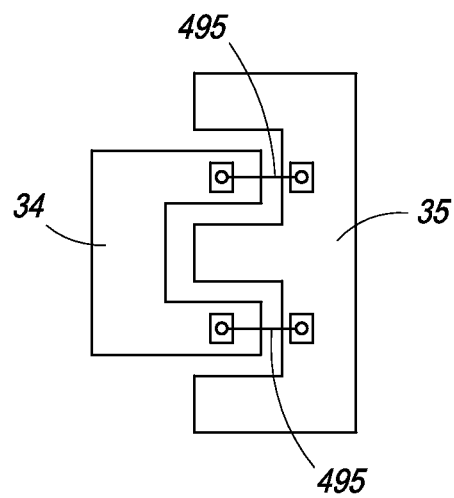
FIG. 27 illustrates a plan view of a portion of another embodiment of a semiconductor device that includes a semiconductor device having a receptacle in accordance with the present invention.

FIG. 27 illustrates a plan view of a portion of another embodiment that may be used for devices 500 and 550. FIG. 27 includes die 34 and 35 (see FIG. 2) where one of die 34 or 35 may represent die 504 that has a receptacle for receiving the other of die 34 or 35. For example, die 34 may represent die 504 with die 35 having protrusions that form a receptacle for receiving die 34. Die 34 and 35 may be interconnected together, such as illustrated by connections 495, as explained in the description of FIG. 26 or may be connected to leads as explained in the description of FIG. 25 or may be connected in a combination of the two connection configurations.

Figure 28:
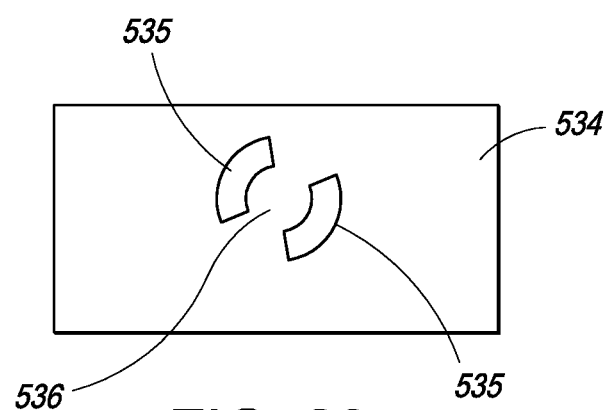
FIG. 28 illustrates an enlarged plan view of a multiply-connected die in accordance with the present invention.

FIG. 28 illustrates an enlarged plan view of a multiply-connected die 534 that has openings 535 through die 534. Openings 535 are positioned to isolate a high frequency portion 536 of die 534 from the remainder of die 534. The silicon removed from openings 535 can range from conductive silicon, such as doped silicon, to a minimum dielectric constant of about 11.7 for intrinsic silicon. By removing the silicon from openings 535, the dielectric constant, such as the dielectric constant between portions of die 534 that are on opposite sides of openings 535, can be drastically reduced down closer to a dielectric constant of 1.0 for air or vacuum. The lower dielectric material separating portion 536 from the remainder of die 534 can be used to minimize capacitive or inductive coupling between the regions.

In view of the explanations herein, one skilled in the art will understand that one example of a method of forming a semiconductor device may include providing a first semiconductor die, such as a die 504, having a receptacle, such as the example receptacle 506, for receiving a second semiconductor die; positioning a second semiconductor die, such as a die 510, within the receptacle; connecting the first semiconductor die to a first connection terminal, such as the example terminal 520, and connecting the second semiconductor die to a second connection terminal, such as connection terminal 521; and encapsulating the first semiconductor die and the second semiconductor die within a semiconductor package, for example package 500.

The example method may also include forming the receptacle as one of an opening through the first semiconductor die, a protrusion along a periphery of the first semiconductor die, or a curved shape along the periphery of the first semiconductor die.

Those skilled in the art will also understand that the explanations herein include one example of a method of forming a semiconductor die that includes, providing a first semiconductor die, such as the example of die 504, having a receptacle for receiving a second semiconductor die, for example receptacle 506; positioning a component, such as the example components 510/546, within the receptacle; connecting the first semiconductor die to a first connection terminal, such as terminal 520; connecting the component to one of the first semiconductor die or to a second connection terminal, such as the example terminal 522; and encapsulating the first semiconductor die and the component, such as encapsulating within a ceramic body.

Those skilled in the art will understand that the method may also include forming the receptacle as one of an opening through the first semiconductor die, a protrusion along a periphery of the first semiconductor die, or a curved shape along the periphery of the first semiconductor die.

The method may also include, positioning one of an alignment key, a heat sink, a gallium arsenide active device, a non-semiconductor active device, a gallium nitride active, or a passive electrical component within the receptacle.

The skilled artisan will understand from the explanations herein that a semiconductor device may comprise a first semiconductor die, such as the example die 504, having a receptacle, such as the example of the receptacle 506, for receiving a component; and a component, for example component 546, positioned within the receptacle.

In other embodiments, openings through the die, such as openings 535 or the openings explained in the description of FIGS. 3-6, may function as a mold lock. For a mold lock, during the process of encapsulating the die with a mold compound, some of the mold compound would extend into the openings to assist in locking the mold compound to the die. Those skilled in the art will appreciate that openings in the die, such as openings 58 (FIG. 3), 104 (FIG. 5), 77 and 75 (FIG. 6), and 535 may be formed during singulation of the die or may be formed prior to singulation. Those skilled in the art will appreciate that other well-known encapsulation techniques or devices may be used instead of a mold compound including glop-top compounds, a ceramic body such as a portion of a ceramic semiconductor package, or other well-known encapsulating devices.

Although die 504 is illustrated with four connections or terminals and die 510 and 546 are illustrated with two connections or terminals, those skilled in the art will appreciate that any of the die may have any number of connections or terminals.

In view of all of the above, it is evident that novel shaped die and a novel method of forming novel shaped die is disclosed. Included, among other features, is forming die with various shapes and maximizing the number of the die that can be formed on the wafer including positioning the die to minimize the amount of the wafer that is wasted.

While the subject matter of the invention is described with specific preferred embodiments and examples of different embodiments, the foregoing drawings and descriptions thereof depict only typical and exemplary embodiments of the invention subject matter and are not therefore to be considered to be limiting of its scope, it is evident that many alternatives and variations will be apparent to those skilled in the art. Those skilled in the art will appreciate that not all of region 49 has to be removed in order to singulate the die but only a portion that surrounds the outer periphery has to be removed, for example, sections 67 may not be removed. Additionally, sections similar to sections 67 or 68 may be used for any of the die on wafer 30. Any of the protective layers, such as the singulation mask, or selective etch layers, such as the dielectric layer or layer 324 described herein may be used to protect the enhancement regions so that they are not etched during the simultaneous singulation of the semiconductor die. The exemplary form of the die described in FIGS. 2-10 and 23, such as die 35-37, are used as a vehicle to describe various methods of singulating the die shapes explained herein; however, those skilled in the art will appreciate that the methods explained for singulating any of the die explained herein are applicable to all die described herein. Additionally, the grouping of the die illustrated in FIGS. 2-10 and 23 are not intended to limit the die to being formed in conjunction with any other particular die shape but that any combinations of the die shapes may be used together.

The invention claimed is:

1. A method of forming a semiconductor die comprising:
providing a semiconductor wafer including a silicon bulk semiconductor substrate having a top surface and a bottom surface;
forming a plurality of semiconductor die on the top surface of the silicon bulk semiconductor substrate with at least one die of the plurality of semiconductor die having two substantially straight sides that intersect to form a first corner at a substantially right angle and forming one or more other corners of the semiconductor die having a different shape than the first corner;
forming a singulation region as a region of the semiconductor wafer that is between the semiconductor die; and
using a dry etch to form an opening through the silicon bulk semiconductor substrate to simultaneously singulate the plurality of semiconductor die and form the first corner and the one or more other corners.

2. The method of claim 1 wherein using the dry etch includes forming the singulation region to have a distance between adjacent semiconductor die of approximately 2 to 20 microns.

3. The method of claim 1 wherein forming the plurality of semiconductor die includes forming the semiconductor die having at least one protrusion along the periphery to have dimensions wherein at least one dimension has a plurality of values.

4. The method of claim 1 wherein forming the plurality of semiconductor die includes forming the semiconductor die to have different areas.

5. The method of claim 1 wherein forming the singulation region includes forming the singulation region as a non-axial singulation line.

6. The method of claim 1 wherein forming the plurality of semiconductor die includes forming at least one of the one or more other corners with a curved shape.

7. The method of claim 1 wherein forming the plurality of semiconductor die includes forming at least one of the one or more other corners with a diagonal connecting the two straight sides.

\* \* \* \* \*